(12) United States Patent
Wilcox

(10) Patent No.: US 10,234,119 B2
(45) Date of Patent: Mar. 19, 2019

(54) MULTIPLE VOLTAGE LIGHT EMITTER PACKAGES, SYSTEMS, AND RELATED METHODS

(71) Applicant: Cree, Inc., Durham, NC (US)

(72) Inventor: Kurt S. Wilcox, Libertyville, IL (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/286,344

(22) Filed: May 23, 2014

(65) Prior Publication Data

US 2015/0267906 A1 Sep. 24, 2015

Related U.S. Application Data

(60) Provisional application No. 61/969,601, filed on Mar. 24, 2014.

(51) Int. Cl.
*H01L 33/36* (2010.01)
*F21V 23/00* (2015.01)
(Continued)

(52) U.S. Cl.
CPC ............ *F21V 23/003* (2013.01); *F21V 5/048* (2013.01); *F21V 23/06* (2013.01); *F21V 29/15* (2015.01); *H01L 25/0753* (2013.01); *H01L 33/486* (2013.01); *H01L 33/62* (2013.01); *H01L 33/64* (2013.01); *F21Y 2113/13* (2016.08); *F21Y 2115/10* (2016.08); *H01L 2924/0002* (2013.01);
(Continued)

(58) Field of Classification Search
CPC ......... H01L 33/62; H01L 33/36; H01L 33/00; F21V 23/003; F21V 23/004; F21V 21/00
See application file for complete search history.

(56) References Cited

U.S. PATENT DOCUMENTS 4,946,547 A 8/1990 Palmour et al.
5,200,022 A 4/1993 Kong et al.
(Continued)

FOREIGN PATENT DOCUMENTS

EP 2860777 A1 4/2015
WO WO 2012/002710 A2 1/2012
(Continued)

OTHER PUBLICATIONS

International Search Report and Written Opinion for Application No. PCT/US 2015/022147 dated Jun. 17, 2015.

*Primary Examiner* — Michael Lebentritt
*Assistant Examiner* — Suberr Chi
(74) *Attorney, Agent, or Firm* — Jenkins, Wilson, Taylor & Hunt, P.A.

(57) ABSTRACT

Light emitter packages, systems, and methods having multiple light emitter chips and operable at multiple voltages are provided. In some aspects, light emitter packages described herein include a submount having a plurality of contact pads and a plurality of light emitting diode (LED) chips disposed over one or more surfaces thereof. The plurality of contact pads are configured to pass electrical current into the plurality of LED chips for allowing the package to be operable in at least two different voltages. The package can be operable at approximately 3 volts (V) or more, approximately 6V or more, approximately 9 V or more, approximately 12V or more, approximately 18 V or more, or approximately 36 V or more.

47 Claims, 12 Drawing Sheets

(51) Int. Cl.
  *F21V 5/04*    (2006.01)
  *F21V 29/15*   (2015.01)
  *F21V 23/06*   (2006.01)
  *H01L 25/075*  (2006.01)
  *H01L 33/64*   (2010.01)
  *H01L 33/62*   (2010.01)
  *H01L 33/48*   (2010.01)
  *F21Y 115/10*  (2016.01)
  *F21Y 113/13*  (2016.01)

(52) U.S. Cl.
  CPC .............. *H01L 2933/0033* (2013.01); *H01L 2933/0066* (2013.01)

(56) References Cited

U.S. PATENT DOCUMENTS

| | | | |
|---|---|---|---|
| RE34,861 E | 2/1995 | Davis et al. | |
| 7,213,940 B1 | 5/2007 | Van de Ven et al. | |
| 7,791,061 B2 | 9/2010 | Edmond et al. | |
| 8,058,088 B2 | 11/2011 | Cannon et al. | |
| 8,482,013 B2 * | 7/2013 | Chai | H05B 33/083 257/83 |
| 8,563,339 B2 | 10/2013 | Tarsa et al. | |
| 8,940,561 B2 | 1/2015 | Donofrio et al. | |
| 9,024,349 B2 | 5/2015 | Chitnis et al. | |
| 2008/0179611 A1 | 7/2008 | Chitnis et al. | |
| 2008/0258130 A1 | 10/2008 | Bergmann et al. | |
| 2010/0051972 A1 * | 3/2010 | Chen | H01L 25/0753 257/88 |
| 2010/0140633 A1 | 6/2010 | Emerson | |
| 2010/0176751 A1 | 7/2010 | Oshio et al. | |
| 2010/0259930 A1 | 10/2010 | Yan | |
| 2011/0031524 A1 * | 2/2011 | Pei | H01L 25/0753 257/99 |
| 2011/0058372 A1 | 3/2011 | Lerman et al. | |
| 2012/0068198 A1 * | 3/2012 | Andrews | H01L 25/0753 257/88 |
| 2012/0086024 A1 * | 4/2012 | Andrews | H01L 25/0753 257/88 |
| 2012/0127720 A1 * | 5/2012 | Hussell et al. | F21V 21/00 362/249.02 |
| 2012/0187862 A1 * | 7/2012 | Britt | H01L 33/62 315/291 |
| 2012/0193651 A1 * | 8/2012 | Edmond | H01L 25/0753 257/88 |
| 2013/0256710 A1 | 10/2013 | Andrews et al. | |
| 2014/0125213 A1 * | 5/2014 | Kong | H01L 33/58 313/46 |
| 2015/0155459 A1 | 6/2015 | Ishihara et al. | |

FOREIGN PATENT DOCUMENTS

| | | |
|---|---|---|
| WO | WO 2013/183693 A1 | 12/2013 |
| WO | WO 2015/148446 A1 | 10/2015 |

* cited by examiner

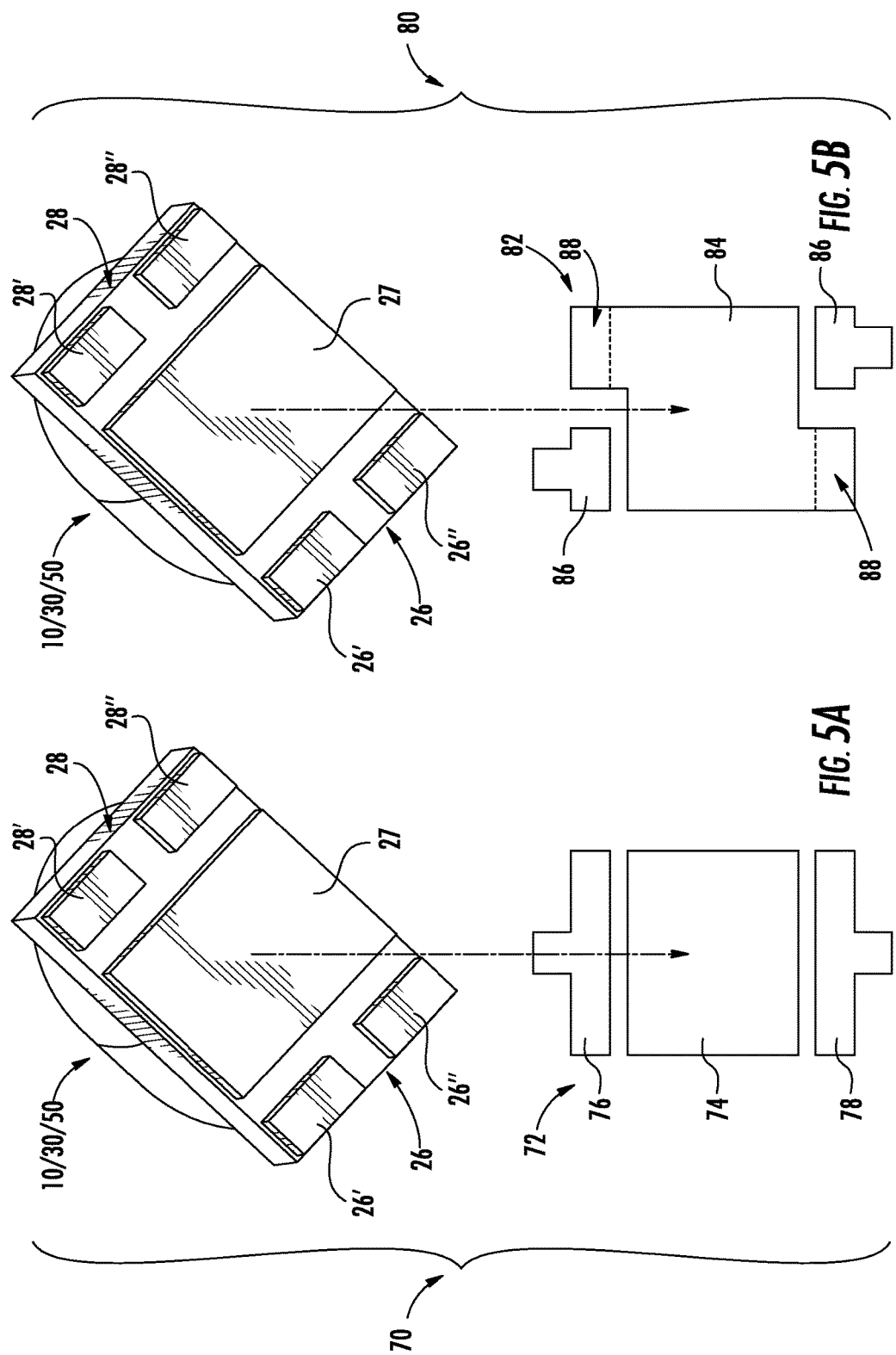

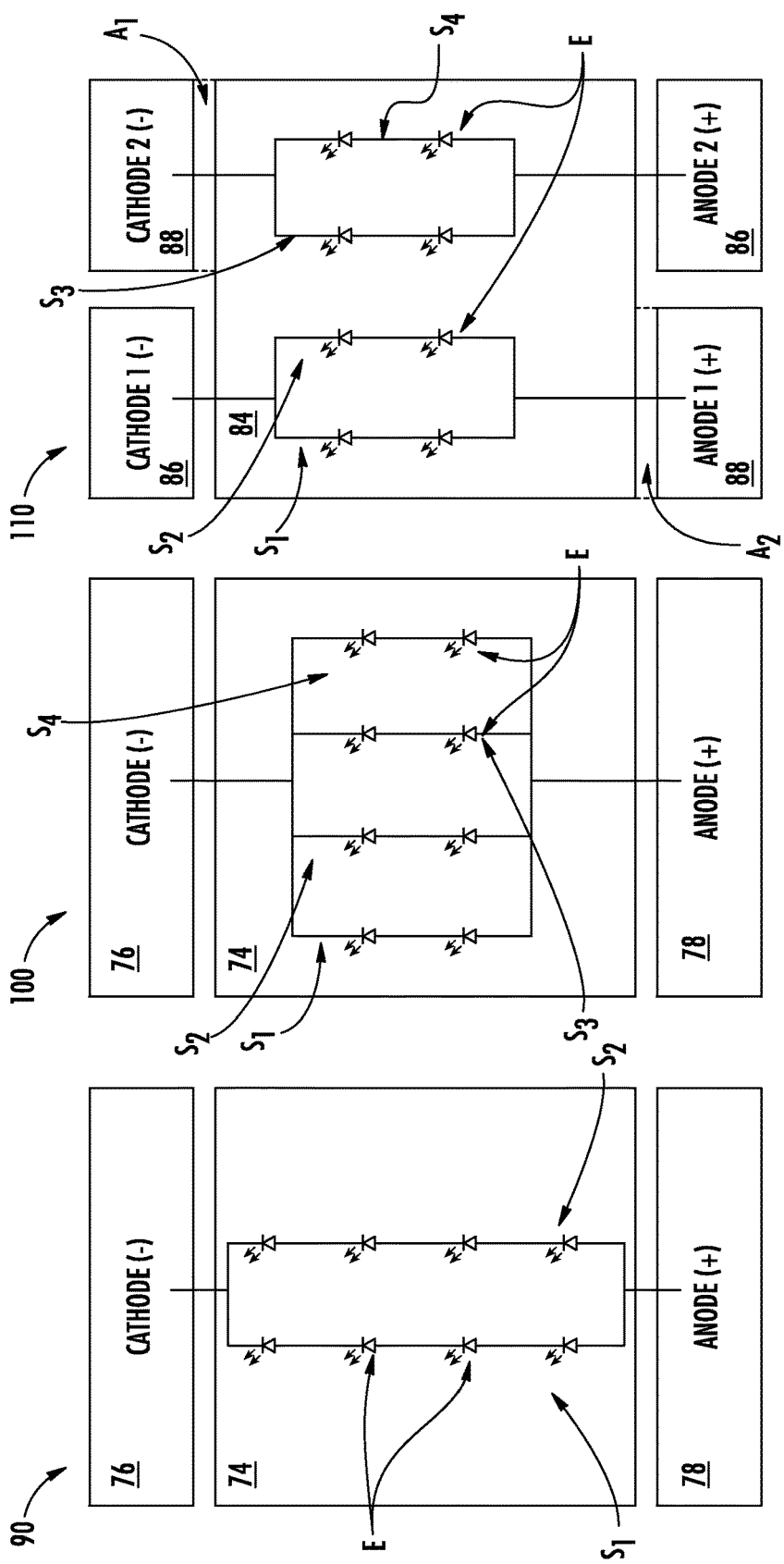

MULTIPLE VOLTAGE LIGHT EMITTER PACKAGES, SYSTEMS, AND RELATED METHODS

CROSS REFERENCE TO RELATED APPLICATION

This application relates to and claims priority to U.S. Provisional Patent Application Ser. No. 61/969,601, filed Mar. 24, 2014, the disclosure of which is incorporated by reference herein in the entirety.

TECHNICAL FIELD

This present subject matter relates to packages and systems for light emitters such as light emitting diode (LED) chips. More particularly, the present subject matter relates to LED packages and systems operable at multiple voltages and related methods.

BACKGROUND

Light emitter chips, such as light emitting diode (LED) chips are solid state devices that convert electric energy to light, and generally include one or more active layers of semiconductor material sandwiched between oppositely doped layers. When an electrical current or bias is applied across the doped layers, holes and electrons are injected into the active layer where they recombine to generate light. Light is emitted from the active layer and from all surfaces of the LED chip.

In order to use an LED chip in a circuit or other arrangement, it is known to enclose the LED chip in an LED package to provide environmental and/or mechanical protection, color selection, focusing and the like. The LED package can include electrical leads, contacts, and/or traces for electrically connecting package to an external circuit, in some aspects via solder pads. When a bias is applied across the external circuit, the LED packages electrically connected thereto (e.g., via solder pads) emit light. Conventional LED packages and external circuitry are limited to a single anode-cathode channel and, therefore, are only operable at a single voltage. Multiple voltages are often needed of the same package, due to constraints at the electrical and system level in different light fixture configurations.

Despite availability of various LED packages and methods in the marketplace, a need remains for improved packages operable across a range of voltages and/or at multiple, specific voltages, for use in both low and high voltage applications. LED packages, systems, and methods described herein can advantageously be used for various low and high voltage applications.

SUMMARY

In accordance with this disclosure, multiple voltage light emitting diode (LED) packages and related methods are provided and described herein. The packages and systems are operable at low and high voltages. In some aspects, a multiple voltage LED package comprises a submount and a plurality of LED chips disposed over the submount. The submount comprises a pair of traces disposed on a first surface thereof and at least two pairs of contact pads disposed on a second surface thereof. The pair of traces and each pair of the contact pads includes an anode and a cathode. The plurality of LED chips are provided over the first surface of the submount and serially connected between the pair of traces. The anode and cathode of only one pair or both pairs of the at least two pairs of contact pads are configured to electrically communicate with each other for providing a package operable at multiple different voltages.

Multiple voltage LED systems are also provided. A system comprises a multiple voltage LED package and an external circuit. A portion of the external circuit comprises a solder pad configured to physically and electrically communicate with the package. The solder pad is configured to apply electrical signal across only one pair or both pairs of the at least two pairs of contact pads for providing a package operable at multiple different voltages.

A method of providing multiple voltage LED packages and systems includes providing a submount, depositing a pair of traces on a first surface of the submount and at least two pairs of contact pads disposed on a second surface of the submount. The pair of traces and each pair of contact pads includes an anode and a cathode. The method further includes serially connecting at least one string of LED chips between the pair of traces. The method further includes passing electrical current either the anode and cathode of only one pair or both for providing a package operable at multiple different voltages.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which:

FIGS. 5A and 5B are views illustrating a system of light emitter packages and solder pads according to embodiments of the present subject matter;

FIGS. 6A to 6C are schematic circuit diagrams illustrating the electrical connectivity of the light emitters of the system of FIGS. 5A and 5B according to embodiments of the present subject matter;

DETAILED DESCRIPTION

Figure 1:
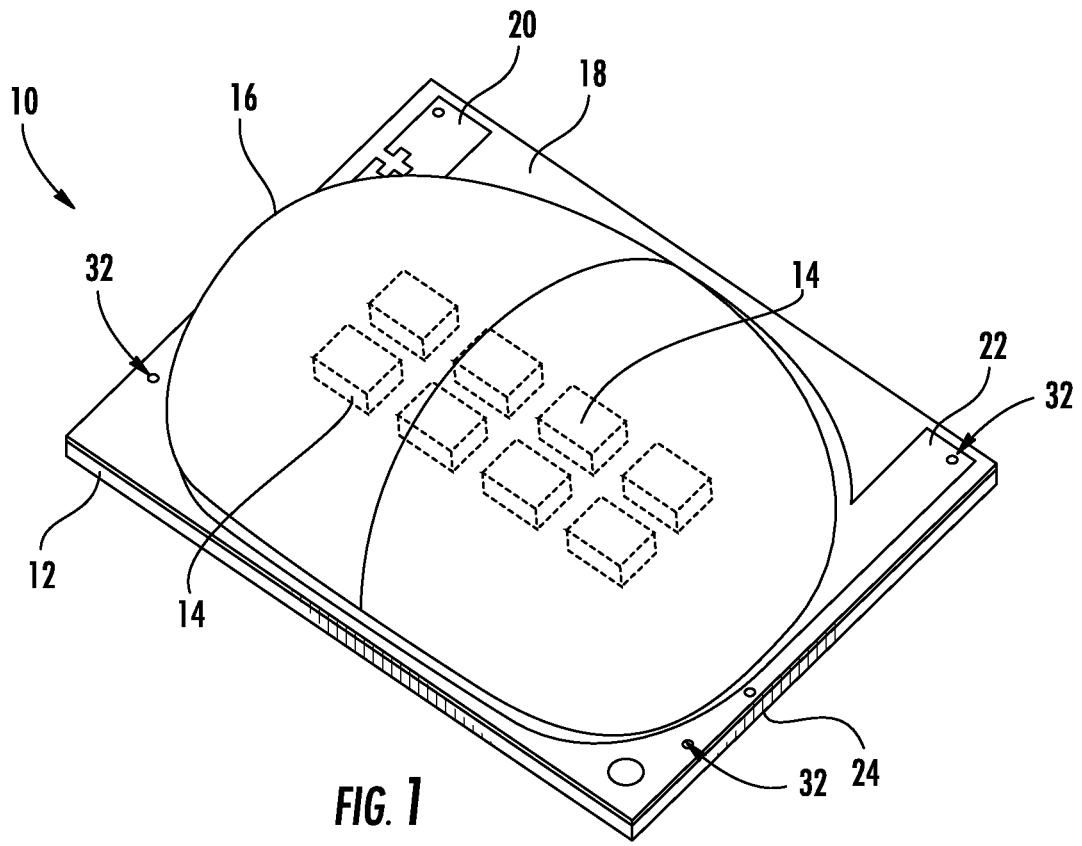
FIGS. 1 and 2 are top and bottom perspective views illustrating a multiple voltage light emitter package according to embodiments of the present subject matter.

The subject matter disclosed herein is directed to packages and methods for use with light emitters, such as light emitting diodes (LEDs). Packages and methods described herein exhibit improved performance, for example, improved efficiency, color rendering, brightness, and/or light extraction at a lower cost than conventional packages. Notably, packages and systems described herein can be selectively operable in both low and high voltage applications. In some aspects, packages, systems, and methods described herein comprise passing electrical current through one or more anode-cathode channels of the package. In some aspects, an electrical circuit includes a solder pad footprint configured to pass electrical current through certain anode-cathode channels of the LED package.

Multiple voltage packages can comprise a submount and a plurality of LED chips disposed over the submount. The submount comprises a pair of traces disposed on a first surface thereof and at least two pairs of contact pads disposed on a second surface thereof. The pair of traces and each pair of the contact pads comprises an anode and a cathode. The plurality of LED chips are provided over the first surface of the submount and serially connected between the pair of traces. The anode and cathode of only one pair or both pairs of the at least two pairs of contact pads are configured to electrically communicate with each other for providing a package operable at multiple different voltages.

In some aspects, light emitter packages described herein comprise a submount having a plurality of contact pads and a plurality of light emitting diode (LED) chips disposed over one or more surfaces thereof. The plurality of contact pads are configured to pass electrical current into the plurality of LED chips for allowing the package to be operable in at least two different voltages. The package can be operable at approximately 3 volts (V) or more, 6V or more, 9 V or more, 12V or more, 18 V or more, or 36 V or more.

Multiple voltage LED systems are also provided. In one embodiment, a system comprises a multiple voltage LED package and an external circuit. A portion of the external circuit comprises at least one or more solder pad configured to physically and electrically communicate with the package. The solder pad is selectively configurable to apply electrical signal across only one pair or both pairs of the at least two pairs of contact pads for providing a package operable at multiple different voltages. More than two pairs of contact pads, each comprising an anode and a cathode, can be provided per package.

Methods of providing multiple voltage packages and/or systems includes providing a submount, and depositing a pair of traces on a first surface of the submount and at least two pairs of contact pads disposed on a second surface of the submount. The pair of traces and each pair of contact pads comprise an anode and a cathode. The method further includes serially connecting at least one string of LED chips between the pair of traces. The method further comprises passing electrical current into either the anode and cathode of only one pair of contact pads or both pairs of pads for providing a package operable at multiple different voltages.

Each example and/or embodiment described herein is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions may be exaggerated relative to other structures or portions for illustrative purposes and, thus, are provided to illustrate the general structures of the present subject matter and may or may not be drawn to scale.

Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the package or component in addition to the orientation depicted in the figures. For example, if the package or component in the figures is turned over, structure or portion described as "above" other structures or portions would now be oriented "below" the other structures or portions. Likewise, if the package or component in the figures are rotated along an axis, structure or portion described as "above", other structures or portions would be oriented "next to" or "left of" the other structures or portions. Like numbers refer to like elements throughout.

Unless the absence of one or more elements is specifically recited, the terms "comprising", including", and "having" as used herein should be interpreted as open-ended terms that do not preclude the presence of one or more elements.

As used herein a "ceramic based material" or the term "ceramic based" includes a material that consists primarily of a ceramic material, such as an inorganic, non-metallic material made from compounds of a metal or metalloid and a non-metal (e.g., aluminum nitride, aluminum oxide, beryllium oxide, silicon carbide). A "non-ceramic based material" consists primarily a metallic material, a primarily organic (e.g., polymeric) material, and/or a primarily synthetic or semi-synthetic organic solid that can be dispensed or molded (e.g., plastic).

In some embodiments, the light emitter package can be configured to refract LED chip emitted light toward a preferential direction. For example, the LED chip array can define an emitter axis, and the lens can have an outer surface and a centerline which can be offset from the emitter axis toward the preferential direction. Further, the lens can be shaped for refraction of LED chip emitted light toward the preferential direction. In some aspects, the light emitter package can comprise an asymmetric overmolded lens.

As used herein with respect to lenses, the term "asymmetric", when unmodified by any further limiting description, refers to a lens shape which is not rotationally symmetric about any axis perpendicular to its base plane. Types of asymmetric lenses can comprise, without limitation, bilaterally symmetric lenses.

Light emitter or LED packages according to embodiments described herein can comprise group III-V nitride (e.g., gallium nitride (GaN)) based LED chips or lasers. Fabrication of LED chips and lasers is generally known and only briefly described herein. LED chips or lasers can be fabricated on a growth substrate, for example, a silicon carbide (SiC) substrate, such as those chips or devices manufactured and sold by Cree, Inc. of Durham, N.C. Other growth substrates are also contemplated herein, for example and not limited to sapphire, silicon (Si), and GaN. In one aspect, SiC substrates/layers can be 4H polytype silicon carbide substrates/layers. Other SiC candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861, U.S. Pat. No. 4,946,547, and U.S. Pat. No. 5,200,022, the disclosures of which are incorporated by reference herein in their entireties. Any other suitable growth substrates are contemplated herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{(1-x)}N$ where 1>x>0 are often used to describe these compounds. Techniques for epitaxial growth of Group III nitrides have become reasonably well developed and reported in the appropriate scientific literature.

Although various embodiments of LED chips disclosed herein can comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based LED chips according to some embodiments of the present subject matter, for example, can be fabricated on growth substrates (e.g., Si, SiC, or sapphire substrates) to provide horizontal chips or devices (with at least two electrical contacts on a same side of the LED chip) or vertical chips or devices (with electrical contacts on opposing sides of the LED chip). Moreover, the growth substrate can be maintained on the LED chip after fabrication or removed (e.g., by etching, grinding, polishing, etc.). The growth substrate can be removed, for example, to reduce a thickness of the resulting LED chip and/or to reduce a forward voltage through a vertical LED chip. A horizontal chip (with or without the growth substrate), for example, can be flip chip bonded (e.g., using solder) to a carrier substrate or printed circuit board (PCB), or wire bonded. In one aspect, horizontal chips are provided such that they are of a bond-pad-down design which eliminates the need for wire bonds. A vertical chip (with or without the growth substrate) can have a first terminal (e.g., anode or cathode) solder bonded to a carrier substrate, mounting pad, or PCB and a second terminal (e.g., the opposing anode or cathode) wire bonded to the carrier substrate, electrical element, or PCB. Examples of vertical and horizontal LED chip structures are discussed by way of example in U.S. Publication No. 2008/0258130 to Bergmann et al. and in U.S. Pat. No. 7,791,061 to Edmond et al. which issued on Sep. 7, 2010, the disclosures of which are hereby incorporated by reference herein in their entireties.

One or more LED chips and/or portions of light emitter packages described herein such as portions of the submount, lens, electrical or electrically conductive traces, and/or wire bonds can be at least partially coated with one or more phosphors. The phosphors absorb a portion of light from the LED chip and emit a different wavelength of light such that the light emitter package emits a combination of light from each of the LED chip(s) and the phosphor(s). In one embodiment, the light emitter package emits what is perceived as white light resulting from a combination of light emission from the LED chip and the phosphor. In one embodiment according to the present subject matter, a white emitting package can consist of an LED chip that emits light in the blue wavelength spectrum and a phosphor that absorbs some of the blue light and re-emits light in the yellow wavelength spectrum. The package can therefore emit a white light combination of blue and yellow light. In other embodiments, the LED chips emit a non-white light combination of blue and yellow light as described in U.S. Pat. No. 7,213,940. LED chips emitting red light or LED chips covered by a phosphor that absorbs LED light and emits a red light are also contemplated herein. Emitter packages described herein can comprise any suitable color temperature such as warm white or cool white color temperatures.

LED chips can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating one or more LED chips are described in U.S. Pat. No. 8,058,088 entitled "Phosphor Coating Systems and Methods for Light Emitting Structures and Packaged Light Emitting Diodes Including Phosphor Coating" which issued on Nov. 15, 2011, and the continuation-in-part application U.S. patent application Ser. No. 12/717,048 entitled "Systems and Methods for Application of Optical Materials to Optical Elements", the disclosures of which are hereby incorporated by reference herein in their entireties. LED chips can also be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety. It is understood that light emitter packages and methods according to the present subject matter can also have multiple LED chips of different colors, one or more of which can be white emitting.

Referring now to FIGS. 1 to 9C, FIGS. 1 and 2 illustrate top and bottom perspective views, respectively, of one embodiment of a light emitter package, or an LED package generally designated 10. The top and bottom views of package 10 are generic to some of the other packages described herein, for example, other packages described herein (FIGS. 3A, 3B, 4A, 4B) can illustrate features in more detail regarding LED chip arrangement and/or conductive trace patterns.

LED package 10 can comprise a substrate or a submount 12 and one or more light emitters disposed over a first surface submount 12. FIG. 1 illustrates light emitters or LED chips 14 in broken lines, as each chip may or may not be visible below an optical element of package 10, such as below a lens 16. In some aspects, a plurality of LED chips 14 and/or an array of LED chips can be provided over submount 12. In some aspects, LED chips are arranged in one or more strings of LEDs (e.g., FIGS. 6A to 6C).

Lens 16 can be a symmetric or an asymmetric lens having a symmetric or an asymmetric dome which is not centered over submount, but rather, offset or positioned closer to one edge of submount 12 for refracting light toward a preferential direction. An example of asymmetric lenses is discussed in commonly assigned U.S. patent application Ser. No. 13/796,045, filed Mar. 12, 2013, which is entirely incorporated herein by reference. Lens 16 can be molded (e.g., overmolded) over a portion of submount 12 and LED chips 14. Lens 16 can comprise a kidney bean shaped (e.g., non-circular or non-domed shaped) lens provided over portions of the array, strings, or multiple LED chips 14. In some aspects, LED chips 14 are centrally disposed below a center of lens 16. In other aspects, LED chips 14 are non-centrally disposed with respect to a center of lens 16.

Notably, LED package 10 is operable at multiple different voltages and/or can be provided within applications requiring several different voltages, as LED chips 14 are selectively, electrically configurable in multiple different arrangements between two or more anode-cathode pairs or anode-cathode "channels". Thus, LED chips 14 within package can be selectively configured to operate at multiple different voltages without having to add new chips, delete chips (e.g., increase or decrease a number of chips which would negatively affect brightness), or manually re-configure the LED chips 14 into different arrangements. Rather, a voltage of LED package 10 can be manipulated and/or varied as desired via routing electrical current differently through the LED chips, in some aspects, using one or more pairs of contact pads (FIG. 2) disposed on a second surface of submount 12 and/or via solder pads (e.g., FIGS. 5A and 5B) of an external circuit.

Submount 12 can comprise any suitable material, and in some aspects comprises a material having a high thermal resistance, low thermal conductivity, and/or be electrically insulating. Suitable materials can include, but are not limited to, ceramic based and/or organic materials, for example, plastics, polymeric materials, aluminum oxide ($Al_2O_3$), aluminum nitride (AlN), polyimide (PI), polyphthalamide (PPA), combinations thereof, and/or any other suitable material having a high thermal resistance.

Submount 12 can also comprise any suitable size and/or shape. In some aspects, submount 12 can be approximately 0.5 millimeters (mm) thick. In other aspects, submount 12 can be between approximately 0.1 and 1.0 mm thick, such as approximately 0.25 mm thick or approximately 0.75 mm thick. Submount 12 can also comprise any desired shape such as a substantially squared, rectangular, non-squared, non-rectangular, circular, symmetrical, and/or asymmetrical shape. Where submount is substantially rectangular, it can comprise a length of approximately 11 mm and a width of approximately 8 mm, such as, for example 11.25×8.22 mm. In other aspects submount 12 can comprise at least one side that is greater than approximately 3.5 mm, 5 mm, 9 mm, or 11 mm.

Submount 12 can comprise a first, top surface 18 and a second, bottom surface 24, where each surface comprises electrically conductive features. The electrically conductive features of top surface 18 (e.g., referred to as traces) can electrically communicate with electrically conductive features of bottom surface 24 (e.g., referred to as surface mount pads or contact pads) using through-holes or "vias" 32 as discussed hereinbelow.

In some aspects, a first electrically conductive trace 20 and a second electrically conductive trace 22 can be provided over portions of top surface 18. First and second traces 20 and 22 can be plated, sputtered, or otherwise deposited using any suitable deposition technique. In some aspects, one of first and second traces 20 and 22, respectively, comprises an anode or anode terminal and the other a cathode or cathode terminal (e.g., forming an anode-cathode pair) across which an electrical bias can be applied for supplying electrical current to multiple LED chips 14. For example and in some aspects, at least one string of LED chips 14 can be mounted between portions of first and second traces 20 and 22, respectively, and electrically connected thereto such that when an electrical bias is applied across the first and second traces 20 and 22, respectively, the LED chips 14 illuminate. LED chips 14 can be provided over a mounting or attach pad as described hereinbelow with regards to FIGS. 3B and 4B.

Figure 2:
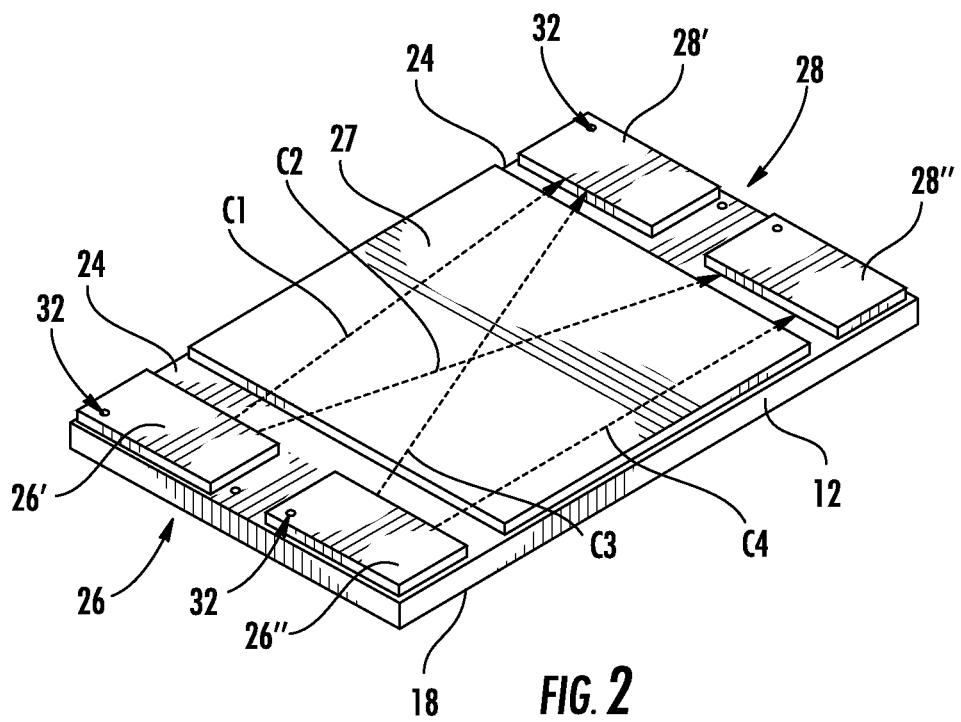

Referring to FIGS. 1 and 2, a plurality of electrically conductive through-holes or vias 32 can be provided at least partially internally and/or within portions of submount 12, for example, extending internally between portions of first trace 20 and one or more contact pads provided over one end 26 (e.g., a first end) of submount 12. Vias 32 can also extend internally between portions of second trace 22 and one or more contact pads provided over another end 28 (e.g., a second end) of submount 12. In some aspects, vias 32 comprise any suitable material(s) deposited and/or plated over submount 12. In some aspects, vias 32 can comprise Ag or a Ag-alloy, Cu or a Cu-alloy, Sn or a Sn-alloy, Au or a Au-alloy, Al or an Al-alloy, or any combination thereof deposited or plated during fabrication of a large submount panels from which individual submounts 12 can be singulated.

Vias 32 can allow electrical signal or current to be communicated from a portion of an external circuit (e.g., a solder pad as illustrated FIGS. 5A and 5B) into package 10 and LED chips 14 via contact pads provided over each end 26 and 28. That is, contact pads can comprise surface mount pads by which package 10 can physically and electrically connect with a circuit (e.g., a PCB, a metal core printed circuit board (MCPCB), flexible circuitry, etc.) or portions thereof (e.g., solder pads of FIGS. 5A and 5B). In some aspects, the multiple contact pads provided over submount 12 can advantageously multiple channels through which electrical signal or current can enter and leave package 10 (e.g., and how electrical current is communicated to one or more LED chips). Such channels can be manipulated, changed, or varied for allowing operability of package 10 at multiple voltages.

Referring to FIG. 2 and in some aspects, multiple contacts pads can be provided at and/or over each of first and second ends 26 and 28 of submount 12. Each contact pad can comprise an electrically conductive material, such as a metal or metal alloy. In some aspects, multiple contact pads designated 26', 26", 28', 28" can be provided over each respective first and second ends 26 and 28 of submount. Although only two pads are illustrated at each end (e.g., 26', 26" at first end 26 and 28', 28" at second end 28) more than two pads can be provided at each end. In some aspects, each contact pad 26', 26", 28', and 28" can be physically separated or spaced apart over submount 12. Notably, a bias can be applied across at least one contact pad provided over first end 26 (e.g., 26' or 26") and one or more contact pads provided over second end 28 (e.g., 28' or 28") for formation of one or more anode-cathode channels. Each channel can electrically communicate with LED chips 14 on top surface 18 of package 10 for illuminating the LED chips 14.

As FIG. 2 illustrates, package 10 can comprise multiple anode-cathode channels comprising anode-cathode pairs. Contact pads 26' and 26" at first end 26 can each either comprise an anode or a cathode terminal. Similarly, contact pads 28' and 28" at second end 28 can each either comprise an anode or a cathode terminal. Contact pads at first and second ends 26 and 28, respectively, can pass electrical current into first and second traces 20 and 22, respectively, using electrically conductive vias 32. Any size, number, shape, and/or configuration of contact pads over bottom surface 24 can be provided. Similarly, any size, number, shape, and/or configuration of traces over top surface 18 can also be provided.

In some aspects, at least one contact pad (e.g., 26', 26") at first end 26 pairs up with at least one contact pad (e.g., 28', 28") or both contact pads at second end 28 for formation of at least one anode-cathode pair (i.e., anode-cathode channel) configured to pass electrical current through package 10. In some aspects, anode-cathode pairs can form or "pair up" by specifying channels using a footprint of an external circuit (e.g., solder pads 5A, 5B), which can facilitate electrical communication and/or drive current between specific contact pads.

In some aspects, a first channel C1 can form between one contact pad 26' at first end 26 and one contact pad 28' at second end 28. An optional second anode-cathode channel C2 can form between one contact pad 26' at first end 26 and a different contact pad 28" at second end 28. Each channel can optionally connect through an isolated conductor or portion 27 of package 10, which can be any suitable configuration and structure. For example and without limitation, portion 27 can be a mounting portion or a thermal pad or component that once mounted can act as a thermal pad and as a connector for the channels. Portion 27 can be physically, electrically, and/or thermally isolated or separated from contact pads at respective ends 26 and 28. An optional third channel C3 is also possible and can form between the other contact pad 26" at first end 26 and one contact pad 28' at second end 28. An optional fourth channel C4 can form between the other contact pad 26" at first end 26 and a different contact pad 28" at second end 28.

Each channel (e.g., C1, C2, C3, and C4) comprises parallel circuits of equal voltage within package 10. Provision of multiple channels allows connection of LED chips 14 in series or parallel to adjust a current/voltage profile of package 10, thereby allowing package to be operable at multiple different voltages. It is understood that contact pads (e.g., 26', 26", 28', and 28") as well as vias 32 can be arranged in many different ways and can have many different shapes and/or sizes. It is also understood that instead of vias, one or more electrically conductive traces can be provided along internal and/or external surfaces of submount 12 between portions of traces (e.g., 20 and 22) and contact pads (e.g., 26', 26", 28', and 28") can be provided.

In some aspects, package 10 can comprise one or more strings of LED chips 14, where each string is configured to emit a different color than at least one other string of LED chips 14. For example, a first string of LED chips 14 can be configured to emit a substantially blue color and another string of LED chips 14 can be configured to emit a substantially red color. Any color(s) of LED chips 14 can be provided within packages and systems described herein, including LEDs chips 14 having a combined light that is substantially white. In some aspects, one channel, such as first channel C1 can be configured to drive one string of LED chips 14 of a same color, and another channel (e.g., C2, C3, or C4) can be configured to drive another string of LED chips 14 having a different color than the one string. This is advantageous as each string can be independent and mutually exclusive from other strings, which can allow for improved color tuning and improved color rendering.

Figure 3A:
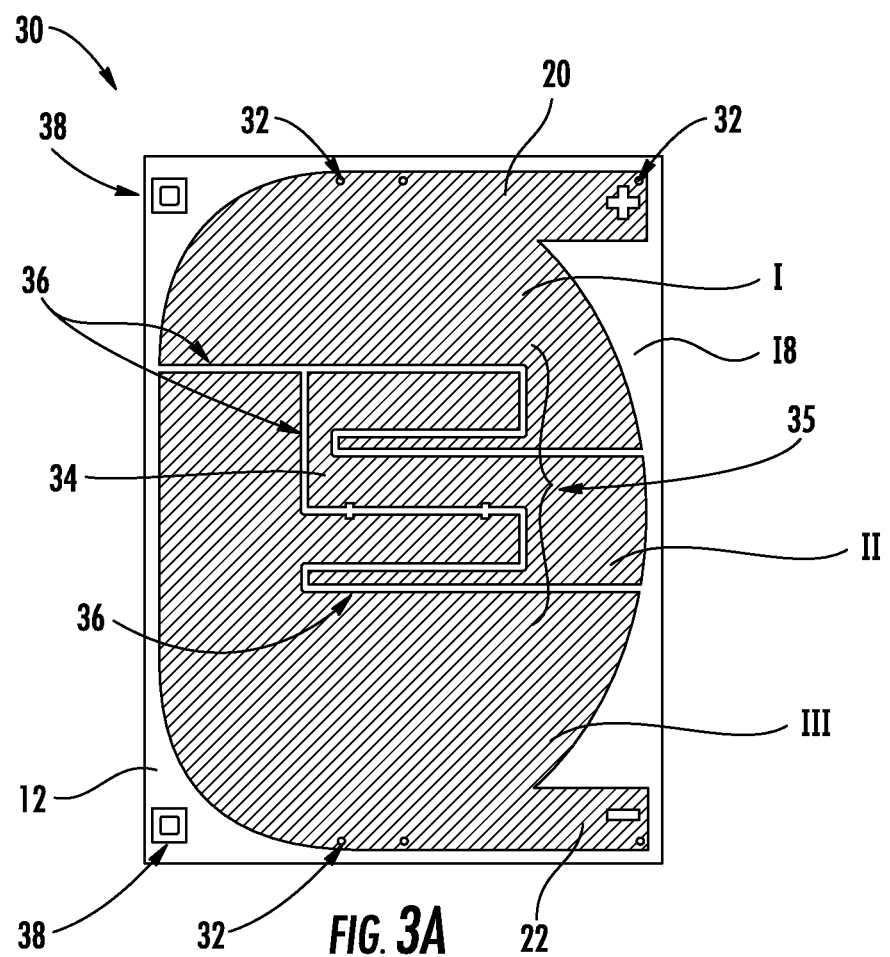
FIGS. 3A and 3B are top views illustrating portions of a multiple voltage light emitter package according to embodiments of the present subject matter.
Figure 3B:
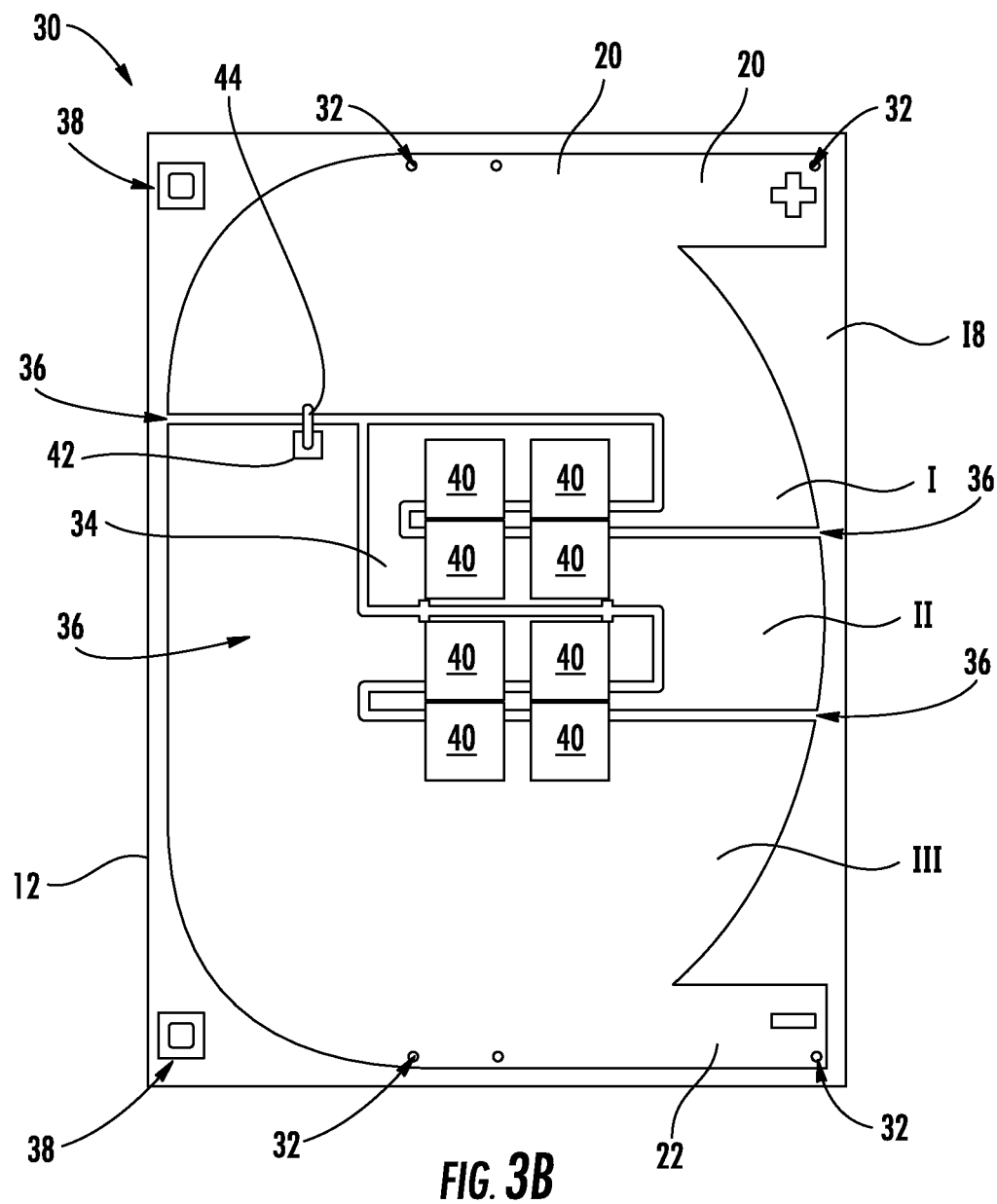

FIG. 3A is a top plan view of a portion of an LED package 30, which, for clarity purposes, is devoid of LED chips and/or an optical element, such as a lens. FIG. 3B illustrates package 30 having one or more LED chips 14 mounted thereto. Package 30 illustrates more detail regarding constructive traces and/or LED chips, but can comprise a generic top side corresponding to FIG. 1 and a generic back side corresponding to and/or including the features of FIG. 2.

Referring to FIGS. 3A and 3B and in some aspects, conductive features including first trace 20 and second trace 22 can be can be patterned over submount 12 of package 30 using known methods. Electrical current can pass into and out of one or more LED chips when a bias is applied across first and second traces 20 and 22, thereby illuminating one or more horizontally structured LED chips 40 (FIG. 3B). Horizontally structured LED chips 40 may not require wirebonds for connection to electrical traces, but can directly attach to traces via bond pads disposed on a bottom surface thereof. In some aspects, the positive and negative contacts of LED chip 40 (e.g., LED chip anode and cathode) are each disposed on a bottom surface of LED chip 40.

One of first trace 20 and second trace 22 comprises a positive terminal and the other a negative terminal (e.g., anode-cathode pair). LED chips 40 can be mounted to a central portion of traces defining a mounting pad 35. In some aspects, LED chips 40 are directly attached to mounting pad 35 via known methods and/or materials such as a solder material that may or may not contain a flux material, silicone, epoxy, and/or dispensed polymeric materials that may be thermally and electrically conductive. In some aspects, the positive and negative terminals (e.g., anode and cathode) of LED chips 40 directly (e.g., physically and electrically) attach to portions of mounting pad 35, such that the package 30 is devoid of wirebonds, or any other wired connectors, for electrically and/or physically attaching LED chips 40 within package 30.

An intermediate trace 34 can be provided between first and second traces 20 and 22 over which LED chips can also attach. Mounting pad 35 and traces (e.g., first, second, and intermediate traces 20, 22, and 34, respectively) can each comprise an electrically conductive material such as a metal, metal-alloy, and/or any other electrically conductive material(s). In one aspect, mounting pad 35 and traces comprise copper that is plated (e.g., electroplated, immersion, immersion-less plating), sputtered, or otherwise deposited (e.g., physically or chemically). In other aspects, a Ti adhesion layer and a copper seed layer can be sequentially sputtered onto submount 12. In yet further aspects, mounting pad 35 and traces can comprise one or more layers of deposited or plated Ti, Cu (electrolytic Cu), and/or Ag (e.g., electrolytic Ag).

One or more gaps 36 can be provided between portions of first trace 20, second trace 22, and intermediate trace 34 for physical and/or electrical separation thereof. In some aspects, an etchant can physically or chemically remove portions of an integral conductive and/or metallic layer of material thereby forming the one or more gaps 36 for physically dividing the integral layer into the plurality of traces and/or the plurality of portions of material denoted I, II, and III. Each portion I, II, and III of material can be configured to pass electrical current into and out of LED chips 40, for illumination thereof. In other aspects, each trace (e.g., 20, 22, and 34) and/or each portion of material I, II, and III can be separately formed and attached or mounted to submount 12 via adhesive, glue, etc. In further aspects, each trace (e.g., 20, 22, and 34) and/or each portion of material I, II, and III can be molded into a portion of submount 12, or produced in any other suitable fashion.

One or more alignment marks 38 can be provided over submount 12 for providing alignment during fabrication of package 30. Alignment marks 38 can and also allow for alignment when mounted in place by an end user.

Referring now to FIG. 3B and in some aspects, LED chips 40 can be serially connected in one or more strings between first and second traces 20 and 22. In some aspects, multiple stings of serially connected LED chips 40 can be provided, where each string is connected in parallel between first and second traces 20 and 22, respectively. Each LED chip 40 can be configured to emit the same color of light and/or multiple LED chips can be configured to emit multiple different colors of light. As noted above, LED chips 40 can comprise horizontally structured chips, however, vertically structured chips can also be provided. Vertically structured chips comprise electrical contacts/bond pads on opposing sides/surfaces wherein horizontally structured chips can comprise electrical contacts or bond pads on a same side/surface. Vertically and/or horizontally structured chips can be configured to attach to electrical components (e.g. traces 20, 22, and 34) within package 30 either directly or via one or more wire bonds (e.g., not shown).

In some aspects, horizontally structured LED chips 40 can be provided where two electrical contacts or two bond pads of opposing electrical polarity (e.g., an anode and a cathode) are disposed on a top surface of the chip. Each bond pad can be wire bonded to an electrically conductive trace of package 10. In other aspects, a horizontally structured LED chip 40 can be provided where two electrical contacts or two bond pads of opposing polarity (e.g., an anode and a cathode) are disposed on a bottom surface of the chip. In this regard, wire bonds can be obviated as each bond pad can directly attach to an underlying electrically conductive trace via a die attach process using flux, flux-eutectic, solder, reflow, epoxy, silicone, combinations thereof, or any suitable die attach material and/or method. Any materials and/or processes capable of attaching LED chips 40 to electrical components (e.g., traces 20, 22, and 34) of package 30 are contemplated herein.

LED chips 40 can be provided over each portion I, II, and III of material comprising electrically conductive traces. In some aspects, eight LED chips 40 can be provided within package 30. The eight LED chips 40 can be configured in different arrangements of serially connected LED chips for operability at different voltages via passing current through different anode-cathode channels comprised of multiple contact pads (FIG. 2). For example, LED chips 40 can be configured into two strings of four serially connected LED chips or a different arrangement, such as four strings of two serially connected LED chips, where each string is connected in parallel. The LED chips 40 can be electrically connected depending upon the desired voltage, which can be changed via routing current differently through multiple sets of contact pads (e.g., channels, FIG. 2).

As FIG. 3B further illustrates, package 30 can further comprise one or more elements for protecting against damage from electrostatic discharge (ESD). In the embodiment shown, an ESD protection device 42 can be mounted such that it is reversed biased with respect to LED chips 40. ESD protection device 42 can comprise a vertical silicon (Si) Zener diode, a different LED chip arranged in parallel and reverse biased to LED chips 40, a surface mount varistor, and/or a lateral Si diode. ESD protection device 42 can be mounted using any known material and/or technique. ESD protection device 42 can also be smaller than LED chips 40 so that it does not cover an excessive area on the surface of the submount 12, and so that it does not block and/or absorb a significant amount of light. ESD protection device 42 allows excessive voltage and/or current passing through LED package 30 from an ESD event to pass through device 42 instead of LED chips 40. ESD protection device 42 can be wire bonded via wire bond 44 to a portion of trace 20. Wire bonds 44 can comprise any suitable electrically conductive material such as Au or a Au-alloy. It is understood that in other embodiments of an LED package according to the present subject matter can be provided without an ESD protection device 42 or with an ESD protection device 42 that is external to LED package 30.

Figure 3C:
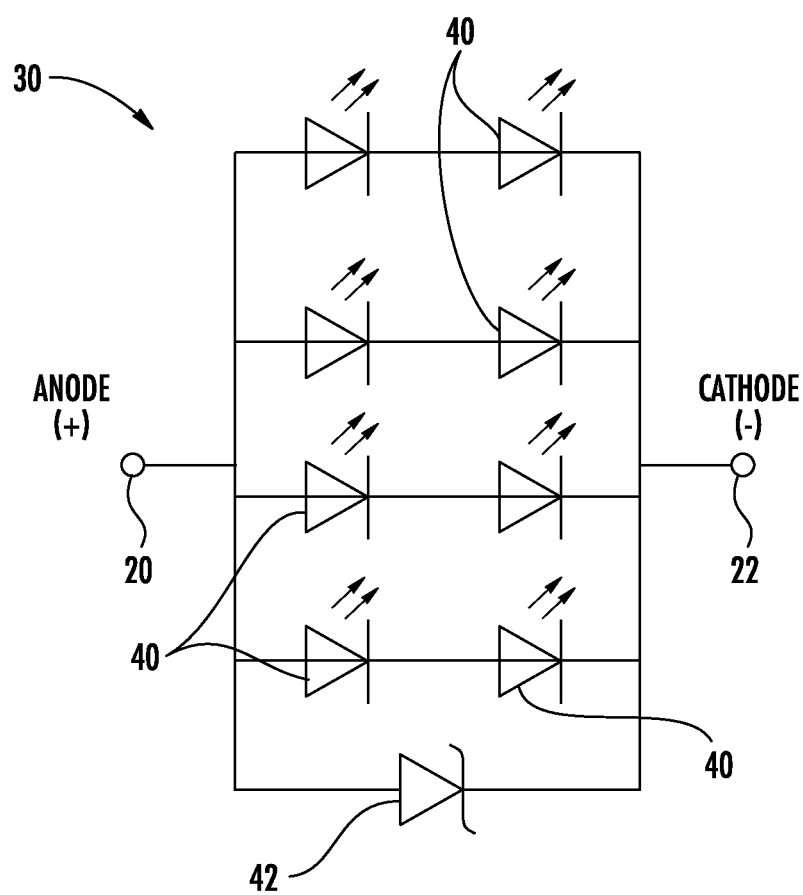
FIG. 3C is a schematic circuit diagram illustrating the electrical connectivity of the light emitters of the package of FIG. 3B.

FIG. 3C is a schematic circuit diagram illustrating the electrical connectivity of the LED chips 40 of package 30 of FIG. 3B, having a back side illustrated in FIG. 2. Notably, the electrical connectivity of LED chips 40 can be changed depending upon how electrical current flows through the package 30, for example, by choosing one of multiple anode-cathode channels (FIG. 2) using multiple contact pads on a back side of package 30. Referring to FIG. 3C, electrical signal from an external power source (not shown) can be applied across anode and cathode terminals (e.g., traces 20 and 22) upon transfer of the electrical current to from or more contact pads (e.g., 26', 26", 28', 28") to traces 20 and 22 by way of electrical vias (32, FIG. 3B).

As FIG. 3C illustrates, the application of electrical bias between anode and cathode terminals (e.g., traces 20 and 22) allows LED chips 40 to emit light. LED chips 40 can be arranged in at least one string of serially connected chips between terminals. As FIG. 3C illustrates, At least two LED chips 40 can be serially connected in at least four strings. Each string can be electrically connected in parallel between first and second traces 20 and 22. In this arrangement, LED package 30 can be operable at approximately 3 volts (V). As described hereinbelow with respect to FIGS. 6A to 6C, LED package 30 can be electrically connected to a solder pad (FIGS. 5A, 5B) which can pass current through package using one or more channels of package, such that package can be operable at a different voltage. In some aspects, packages described herein can be operable at approximately 3V, approximately 6V, approximately 9V, approximately 12V, approximately 18V, approximately 36V, approximately 72V, or any range therebetween.

Figure 4A:
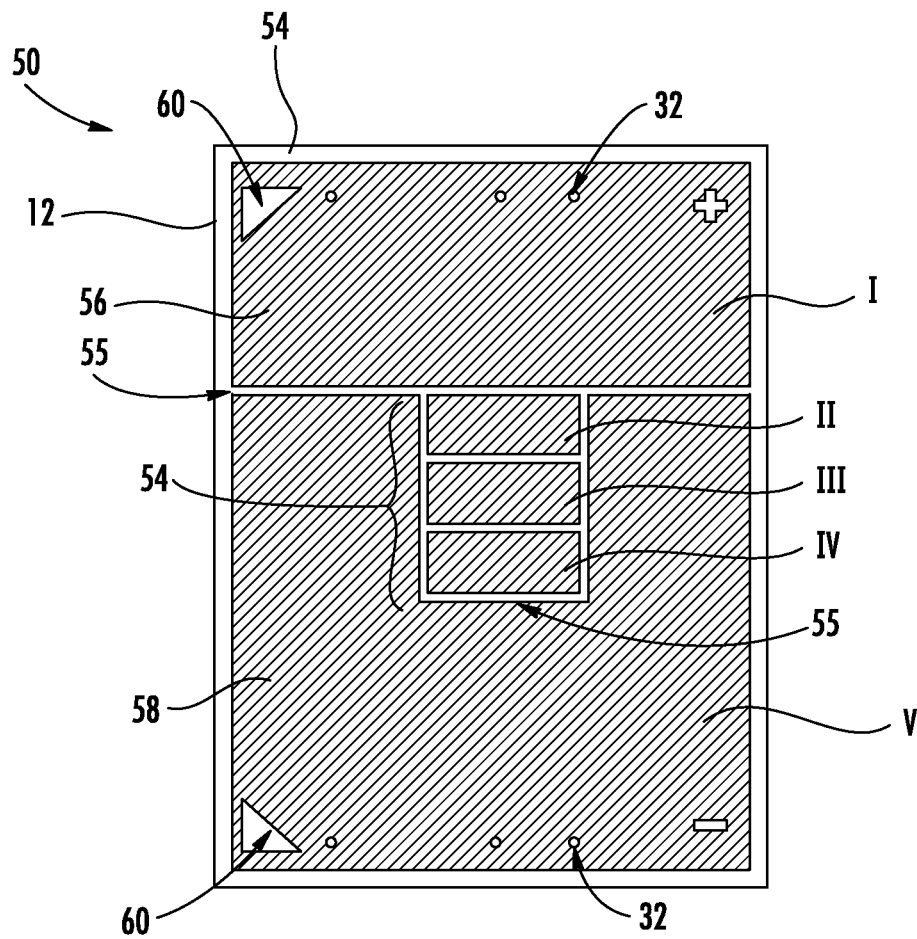
FIGS. 4A and 4B are top views illustrating portions of multiple voltage light emitter packages according to embodiments of the present subject matter.
Figure 4B:
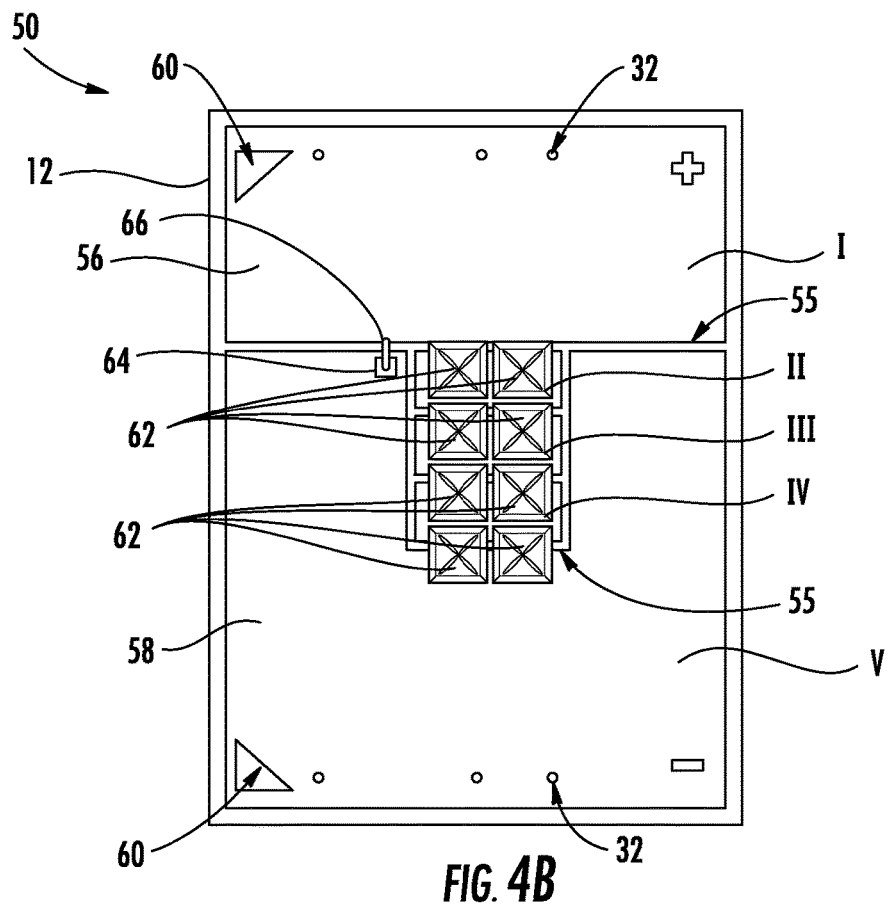

FIGS. 4A and 4B illustrate a top plan view of a portion of an LED package 50, which, for illustration purposes, is devoid of LED chips and/or an optical element, such as a lens. FIG. 4B illustrates package 50 having one or more LED chips 62 mounted thereto. Package 50 illustrates more detail regarding conductive traces and/or LED chips, but can comprise a generic top side corresponding to and/or including at least some of the features of FIG. 1 and a generic back side corresponding to and/or including at least some of the features of FIG. 2.

Referring to FIGS. 4A and 4B and in some aspects, conductive features including a first trace 56 and second trace 58 can be can be patterned over a top surface of submount 12 of package 50 using known methods. Electrical current can pass into and out of one or more LED chips 62 when a bias is applied across first and second traces 56 and 58, thereby illuminating one or more horizontally structured LED chips 62 (FIG. 4B).

One of first trace 56 and second trace 58 comprises a positive terminal and the other a negative terminal (e.g., anode-cathode pair). LED chips 62 (FIG. 4B) can be mounted to one or more central portion of traces collectively referred to as a mounting pad. In some aspects, LED chips 40 are directly attached to mounting pad via known methods and/or materials such as a solder material that may or may not contain a flux material, silicone, epoxy, and/or dispensed polymeric materials that may be thermally and electrically conductive.

One or more intermediate traces 54 can be provided between first and second traces 56 and 58, over which LED chips can also attach, and can collectively define the mounting pad. Traces (e.g., first, second, and intermediate traces 56, 58, and 54, respectively) can each comprise an electrically conductive material such as a metal, metal-alloy, and/or any other electrically conductive material(s). In one aspect, traces 56, 58, and 54 comprise copper that is plated (e.g., electroplated, immersion, immersion-less plating), sputtered, or otherwise deposited (e.g., physically or chemically) using known techniques. In other aspects, a Ti adhesion layer and a copper seed layer can be sequentially sputtered onto submount 12. In yet further aspects, traces 56, 58, and 54 can comprise one or more layers of deposited or plated Ti, Cu (electrolytic Cu), and/or Ag (e.g., electrolytic Ag).

One or more gaps 55 can be provided between portions of first trace 56, second trace 58, and intermediate traces 54 for physical and/or electrical separation thereof. In some aspects, an etchant can physically or chemically remove portions of an integral conductive and/or metallic layer of material thereby forming the one or more gaps 55 for physically dividing the integral layer into a plurality of traces and/or a plurality of portions of material denoted I, II, III, IV and V. Each physically separated portion I, II, III, IV and V of material can be configured to pass electrical current into and out of LED chips 62 (FIG. 4B, for illumination thereof. In other aspects, each trace (e.g., 56, 58, and 54) and/or each portion of material I, II, III, IV and V can be separately formed and attached or mounted to submount 12 via adhesive, glue, etc. In further aspects, each trace (e.g., 20, 22, and 34) and/or each portion of material I, II, III, IV and V can be molded into a portion of submount 12, or produced in any other suitable fashion.

One or more alignment marks 60 can be provided over submount 12 for providing alignment during fabrication of package 50. Alignment marks 60 can and also allow for alignment when mounted in place by an end user.

Referring now to FIG. 4B and in some aspects, LED chips 62 can be serially connected in one or more strings between first and second traces 56 and 58. In some aspects, multiple stings of serially connected LED chips 62 can be provided, where each string is connected in parallel between first and second traces 56 and 58, respectively. Each LED chip 62 can be configured to emit the same color of light and/or multiple LED chips can be configured to emit multiple different colors of light. As noted above, LED chips 62 can comprise horizontally structured chips, however, vertically structured chips can also be provided. Vertically and/or horizontally structured chips can be configured to attach to electrical components (e.g. traces 56, 58, and 54) within package 50 either directly or via one or more wire bonds (e.g., not shown).

In some aspects, a horizontally structured LED chip 62 can be provided where two electrical contacts or two bond pads of opposing polarity (e.g., an anode and a cathode) are disposed on a bottom surface of the chip. In this regard, wire bonds can be obviated as each bond pad can directly attach to an underlying electrically conductive trace via a die attach process using flux, flux-eutectic, solder, reflow, epoxy, silicone, combinations thereof, or any suitable die attach material and/or method. Any materials and/or processes capable of attaching LED chips 62 to electrical components (e.g., traces 56, 58, and 54) of package 50 are contemplated herein.

Portions of at least some LEDs chip 62 can be provided over each portion I, II, III, IV and V of material comprising electrically conductive traces. In some aspects, eight LED chips 62 can be provided within package 50. The eight LED chips 62 can be configured in different arrangements of serially connected LEDs for operability at different voltages via passing current through different anode-cathode channels comprised of multiple contact pads (FIG. 2). For example, LED chips 62 can be configured into two strings of four serially connected LED chips or a different arrangement, such as four strings of two serially connected LED chips, where each string is connected in parallel. The electrical connection of LED chips 62 can be changed depending upon the desired voltage, and can be changed via routing current differently through multiple sets of contact pads (e.g., and/or channels, FIG. 2) as desired.

As FIG. 4B further illustrates, package 50 can further comprise one or more elements for protecting against damage from electrostatic discharge (ESD). In the embodiment shown, an ESD protection device 64 can be mounted such that it is reversed biased to LED chips 62. ESD protection device 64 can comprise a vertical silicon (Si) Zener diode, a different LED chip arranged in parallel and reverse biased to LED chips 62, a surface mount varistor, and/or a lateral Si diode. ESD protection device 64 can be mounted using any known material and/or technique, such as with a wired connector 66. It is understood that in other embodiments of an LED package according to the present subject matter can be provided without an ESD protection device 64 or with an ESD protection device 64 that is external to LED package 50.

As described hereinbelow with respect to FIGS. 6A to 6C, LED package 50 can be electrically connected to a solder pad (FIGS. 5A, 5B) which can apply current through package via one or more channels of package, such that package 50 can be operable at different voltages. In some aspects, packages described herein can be operable at approximately 12V. However, package 50 can also be operable at approximately 6V, or any voltage or voltage range between approximately 6 and 12V by altering the flow of current between one or more contact pads (e.g., FIG. 2) which send/receive current from traces (e.g., 56, 58) by way of vias 32.

The LED chip arrangements illustrated herein can advantageously allow the plurality of LED chips 62 to be spaced close together (i.e., closely packed) having a relatively small footprint while maintaining a high efficiency, brightness and light output. LED chips 62 can comprise a same color and/or differently colored chips can be combined in various color combinations to achieve a desired CRI, color temperature, aggregate wavelength, and/or other color-related characteristic.

In one aspect, LED chips 62 can be selected from various light color or wavelength bins for providing a combined light output with a high color rendering index (CRI). LED packages described herein can be configured to emit cool white light, warm white light, natural white light, or a true white light. The desired color mixing may be achieved, for example, by using blue, blue-shifted-yellow (BSY), green, cyan, amber, red and/or red-orange LED chips 62. An optional phosphor can be locally applied over each LED chip 62 and/or portions of package 50 (e.g., over traces and/or portions of an optical element or lens (FIG. 1)). An example of selecting chips from various color bins to produce desired color characteristics is described in commonly assigned U.S. Patent Application 2010/0140633, filed Apr. 17, 2009, which is entirely incorporated herein by reference. A detailed example of using groups of LED chips emitting light of different wavelengths to produce substantially white light can also be found in commonly assigned U.S. Pat. No. 7,213,940, which issued on May 8, 2007 and which is entirely incorporated herein by reference.

LED chips 62 can comprise square chips that are approximately 700 microns (p or µm) in size, meaning that chips can be approximately 700 microns wide per side. LED chips 62 could also be less than or approximately equal to 1000 µm in size, such as approximately 500 microns in size; approximately 300 µm in size; or less than approximately 300 µm. LED chips 62 can be substantially rectangular or square in shape, and can comprise any suitable dimension. Packages described herein can comprise a surface mount design (SMD) type of package adapted to incorporate various sizes, structures, build, colors, design, and/or types of LED chips. Direct-attach chips, flip-chips, and chips with substrates made of sapphire, silicon carbide, silicon or other materials are contemplated herein.

Packages described herein can further comprise a symbol or indicator for designating electrical polarity of a given side of LED package 50 (e.g., a "+" or "−" sign). This can ensure accurate mounting of LED chips 62 within LED package 50 as well as accurate mounting of LED package 50 to an external circuit (e.g., PCB, MCPCB) or other component, whether by machine or by hand. In the embodiment shown the symbols comprise a plus (+) sign over first trace 56, indicating that package 50 should be mounted with the positive side of electrical signal coupled to first trace 56. It is understood that many different symbol types can be used and that a symbol can also be included over the second trace 58 such as a minus sign (−) indicating that package 50 should be mounted with the negative side of electrical signal coupled to second trace 58. It is also understood that different symbols can be used, and that the symbols can be placed in other locations.

Figure 4C:
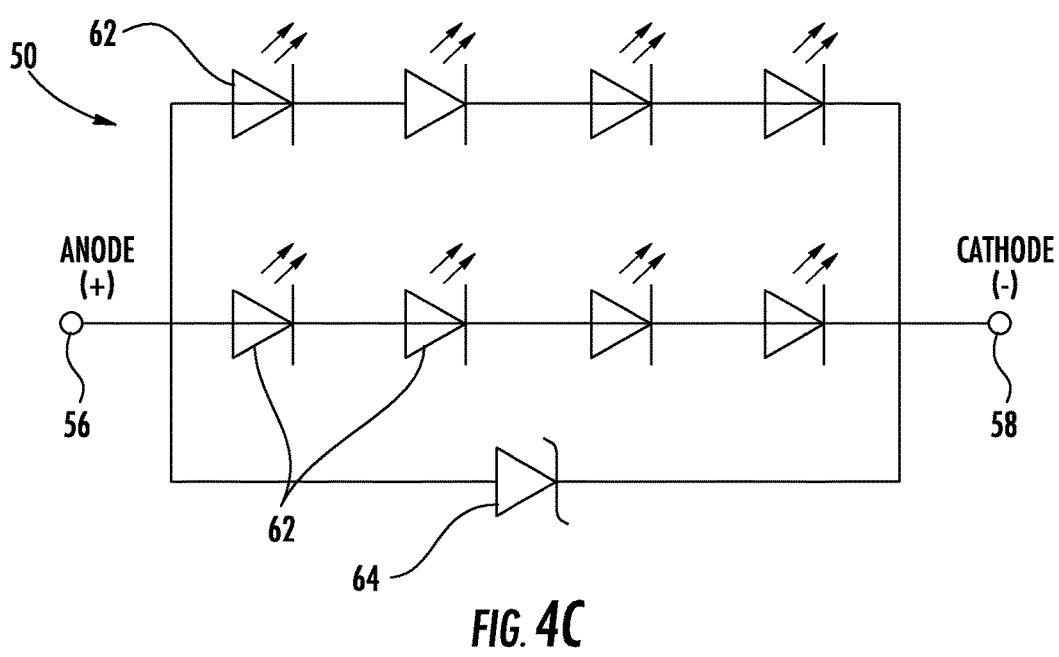
FIG. 4C is a schematic circuit diagram illustrating the electrical connectivity of the light emitters of the package of FIG. 4B.

FIG. 4C is a schematic circuit diagram of the LED package in FIG. 4B. The circuit can comprise eight LED chips 62, where four LED chips 62 are serially connected between the anode and cathode (e.g., first and second traces 56 and 58). Each serially connected string of LED chips 62 is connected in parallel between the first and second trace 56 and 58, respectively. Electrical signal or current for illuminating LED chips 14 can be supplied by a power source (not shown). ESD protection device 64 can be connected in parallel to and reverse biased with respect to each string of LED chips 62.

FIGS. 5A and 5B illustrate systems 70 and 80, respectively, comprising LED packages 10/30/50 and portions of an external power source (e.g., a PCB, MCPCB, flex circuit, etc.), such as a solder pad 72 and 82, respectively. Solder pads 72 and 82 can comprise a footprint of exposed electrically conductive material or portions of an external power source (e.g., PCB, MCPCB, flex circuit, etc.) over which LED packages 10/30/50 can physically attach to in some aspects via soldering, welding, reflowing, etc. In some aspects, solder pads 72 and 82 comprise areas of raised metal, such as Au, Ag, Cu, Al, Sn, alloys thereof, any metal or metal alloy, or any other electrically conductive material. Notably, solder pads can present multiple anode-cathode channels for LED packages 10/30/50 such that a user can connect the LED chips thereof in series, parallel, or combination thereof for adjusting the current/voltage profile as needed.

Referring to FIG. 5A, solder pad 72 can comprise a pattern having a central portion 74 disposed between one or more electrically isolated outer portions 76 and 78. In some aspects, central portion 74 is physically separated and electrically isolated from each outer portion 76 and 78, and can comprise a heat sink to which LED packages 10/30/50 can offload and/or transfer heat to upon connection of LED packages 10/30/50 to solder pad 70. For example, portion 27 of packages 10/30/50 can be configured to physically and thermally connect with central portion 74 of solder pad 72 via soldering the package thereto. Heat generated within LED package 10/30/50 can dissipate into central portion 74 and advantageously allow the packages to run cooler.

Solder pad 72 can comprise a single channel solder pad where LED packages 10/30/50 can be connected in parallel over an external source (e.g., a PCB, MCPCB, circuit, flex circuit, etc.). Connecting LED packages in parallel can allow adjustments to the component current/voltage profile allowing operability at multiple voltages. Outer portions 76 and 78 can each comprise a positive or a negative terminals (e.g., an anode or a cathode) for supplying current through LED package 10/30/50. In some aspects, outer portions 76 and 78 are backwards compatible with other existing solder pad footprints to realize a parallel configuration (e.g., multiple packages 10/30/50 electrically connected in parallel) over an external source or circuit.

In some aspects, one of outer portions 76 and 78 comprises a positive terminal and the other a negative terminal (e.g., forming an anode-cathode pair) adapted to apply electrical current through LED packages 10/30/50 upon connection thereto. Contact pads 26', 26" at first end 26 and contact pads 28' and 28" at second end of packages 10/30/50 are each configured to physically and electrically connect to one of the outer portions of solder pad 72. For example, contact pads 26' and 26" can each physically and electrically connect with outer portion 76 and contact pads 28' and 28" can each physically and electrically connect with the other, second outer portion 78. Thus, the anode-cathode pairs of package 10/30/50 comprise contact portions 26'-28' and 26"-28". Each anode-cathode pair can be directly aligned and in parallel. Solder pad 72 comprises a single channel solder pad. LED chips within package 10/30/50 are operable at approximately 6V, 12V, or more than 12V. The package current/voltage profile can be changed allowing for a multiple voltage package and system where a solder pads exchange current between different anode-cathode channels of a multiple voltage LED package 10/30/50.

Referring to FIG. 5B, solder pad 82 can comprise a single or multiple channel solder pad where LED packages 10/30/50 can be connected in series over an external source (e.g., a PCB, MCPCB, circuit, flex circuit, etc.). Connecting LED packages as connected series can also allow adjustments to the component current/voltage profile allowing operability at multiple voltages. Solder pad 82 can comprise central portion 84 provided between outer portions. Notably, when connecting LED packages in series, anode-cathode pairs or "channels" can connect through the isolated heat sink or portion 27 of packages 10/30/50 via connection to central portion 84, for allowing a series configuration without having to take up any more room on the circuit board and/or without requiring complex multi-layer circuit construction.

Each outer portion of solder pad 82 can comprise at least two electrically isolated portions 86 and 88 or footprints. The electrical isolated portions 86 and 88 at one end (e.g., the top) of the solder pad 82 can comprise a same polarity that opposes the polarity of portions 86 and 88 at the other end (e.g., at the bottom of solder pad 82). Notably however, some of the outer portions 88 can electrically connect through central portion 84, where desired, for connecting LED packages 10/30/50 in series and for allowing the packages to be operable at different voltages. In other aspects, outer portions 88 may not be connect to central portion 84, where outer portions 88 are isolated from central portion 84 along the broken lines. That is, outer portions 88 of solder pad 82 could be severed, via etching or otherwise, from central portion 84 to provide multiple anode-cathode channels.

In some aspects, outer portions 86 and 88 are configured for connecting to pairs of contact pads of opposing polarity (e.g., 26' and 26" oppose the polarity of 28' and 28") for formation of different anode-cathode pairs or channels (e.g., FIG. 2). The number of channels can be changed, increased, or decreased based upon the connection of LED package 10/30/50 to solder pad 82 footprints. Notably, solder pad 82 can allow packages 10/30/50 to run at multiple voltages depending upon the connection to contact pads (e.g., 26', 26", 28' and 28"). In some aspects, system 80 comprised of LED package 10/30/50 and solder pad 82 can be operable at less than approximately 6V (e.g., 3V), approximately 6V, approximately 12V, or more than approximately 12V where desired and depending upon how the end user connects LED packages 10/30/50 to solder pad 82 and to each other over a circuit board.

One set of outer portions 86 and 88 can comprise a positive terminal and the other set of outer portions 86 and 88 can comprise a negative terminal (e.g., an anode or a cathode) for supplying current through LED package 10/30/50. In some aspects, contact pads 26' and 26" can each physically and electrically connect with one set of outer portions 86 and 88 (e.g., the lower or upper set as seen in FIG. 5A) and contact pads 28' and 28" can each physically and electrically connect with the other remaining set of outer portions 86 and 88. Thus, the anode-cathode pairs of package 10/30/50 comprise contact portions 26'-28' and 26"-28".

As FIGS. 5A and 5B collectively illustrate and in some aspects, package portion 27 comprises a thermal component that is selectively configurable for electrically communicating with an external circuit thereby allowing the package to be operable in at least two different voltages. That is, portion 27 is selectively configurable to either remain electrically isolated from an external circuit comprised of solder pad 72 (FIG. 5A) or electrically communicate with an external circuit comprised of solder pad 82 (FIG. 5B). Configuring portion 27 to be electrically connectable to and/or electrically isolated from an external circuit can provide for a multiple voltage packages and systems described herein. For example, portion 27 is configurable in both electrically active and inactive arrangements with respect to solder pads for providing variable voltage LED packages and/or systems. Packages and systems described herein are configurable in at least two different voltages by passing electrical current differently via contact pads, portion 27, solder pads (e.g., 72, 82), and/or combinations thereof.

FIGS. 6A to 6C are schematic circuit diagrams illustrating some examples of the electrical connectivity of the light emitters within systems such as those depicted in FIGS. 5A and 5B according to embodiments of the present subject matter. As FIGS. 6A to 6C illustrate, systems 90, 100, and 110, respectively, can include a package comprising at least one string of light emitters, generally designed E, and a portion of an external circuit such as a solder pad. Electrical signal received via or more anode-cathode channels can provide a multiple voltage system. Each light emitter can comprise an LED chip such as those available from Cree, Inc. located in Durham, N.C.

The electrical connectivity, and therefore the voltage at which light emitter packages and systems operate can be changed or varied depending upon how the emitters E are connected between one or more anode-cathode channels (FIG. 2). In some aspects, electrical signal or current can be routed between different and/or multiple anode-cathode channels using the package contact pads (e.g., 26', 26", 28', 28", FIG. 2), solder pads (e.g., 72, 82, FIGS. 5A and 5B), or a combination thereof.

In FIG. 6A, any number of light emitters E, for example eight emitters E, can be provided in a first string S1 and a second string S2 between an anode and cathode. Each string S1 and S2 can be electrically connected in parallel between the anode and the cathode, and each string can comprise a same quantity of emitters E or different quantities of emitters. Each string S1 and S2 can comprise emitters E configured to emit approximately a same color of light, or different colors of light. Emitters E can be configured to receive current from an external source, for example, via outer portions of solder pads 76 and 78 of an external circuit (see also, FIG. 5A). Central portion 74 of solder pad can remain electrically isolated from outer portions 76 and 78 for dissipating heat from emitters E. In some aspects, FIG. 6A illustrates a single anode-cathode channel system operable at approximately 12V.

In FIG. 6B, light emitters E can be provided in a first string S1, a second string S2, a third string S3, and a fourth string S4 between an anode and cathode (e.g., traces). In some aspects, eight emitters E can be provided (e.g., the same quantity as FIG. 6A). However, by varying the electrical connectivity of emitters E, the package voltage can be changed. In some aspects, string S1, S2, S3, and S4 can be electrically connected in parallel, and can comprise a same quantity of emitters E or different quantities of emitters. In some aspects, each string comprises four emitters E. Each string S1, S2, S3, and S4 can comprise emitters E configured to emit approximately a same color of light, or different colors of light. Emitters E can be configured to receive current from an external source, for example, via outer portions of solder pads 76 and 78 of an external circuit (see also, FIG. 5A). Central portion 74 of solder pad can remain electrically isolated from outer portions 76 and 78 for dissipating heat from emitters E. In some aspects, FIG. 6B also illustrates a single anode-cathode channel system. The package and/or system are operable at approximately 6V.

In FIG. 6C, eight light emitters E can be provided in first and second strings S1 and S2, respectively, between a first anode-cathode channel. Each anode-cathode channel can be independent and mutually exclusive. System 110 can further comprise a third string S3 and a fourth string S4 of emitters E provided between an additional, second anode-cathode channel. The first anode-cathode channel (e.g., on the left between outer portions 86 and 88) is configured to flow electrical current or signal through first and second strings S1 and S2 of emitters E. The second anode-cathode channel (e.g., on the right between outer portions 86 and 88) is configured to flow electrical signal through third and fourth strings S3 and S4. First and second strings S1 and S2 can be independently driven and mutually exclusive with respect to third and fourth strings S3 and S4, respectively. This is advantageous, as separately driven strings and/or emitters receiving current from different anode-cathode channels can allow for string balancing requirements and/or color tuning. For example, strings of emitters E can comprise different colors such as red and/or blue (e.g., BSY), yellow, green, cyan, amber, orange, etc.) emitters E, where one anode-cathode channel supplies current to one color of emitters and the other anode-cathode channel supplies current to the other color. This can improve color rendering and allow for improved color tuning options.

Notably, in some aspects outer portions 88 and 86 of solder pad (82, FIG. 5B) can electrically connect through central portion 84 where the portions are connected at areas A1 indicated in broken lines and as seen in FIG. 5B. That is, in some aspects solder pad 82 (FIG. 5B) can be configured as a single channel solder pad (FIG. 5B) or as a multiple channel solder pad (FIG. 6C) configured to supply current to multiple independent stings of LED chips or emitters E.

FIGS. 6A, 6B, and 6C can each include eight LED chips or emitters E, however, the voltage of each package and/or system can differ either based upon the connectivity of the chips, or by using one or more (e.g., multiple) anode-cathode channels. Multiple anode-cathode channels can be provided via routing current between multiple contact pads (FIG. 2), multiple solder pad portions (FIGS. 5A and 5B), and/or combinations thereof. Multiple anode-cathode channels provided on the emitter package and/or solder pad can provide devices and systems operable at multiple voltages, including a range of voltages between approximately 6V and 72V.

Figure 7:
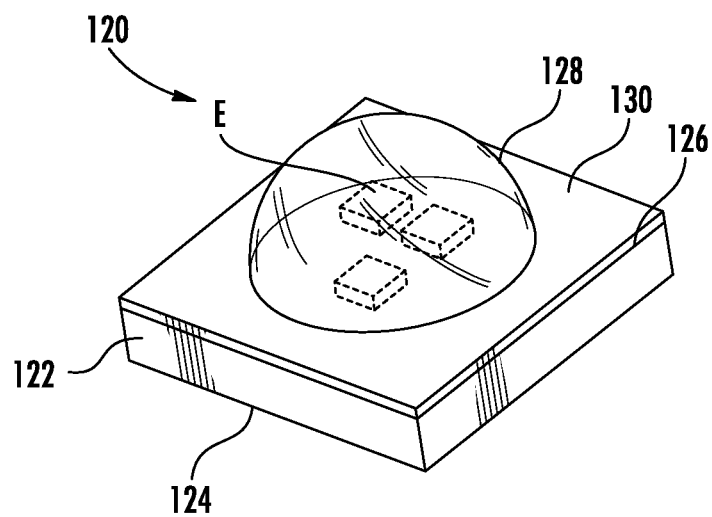
FIGS. 7 and 8 are top and bottom views illustrating multiple voltage light emitter packages according to embodiments of the present subject matter.
Figure 8:
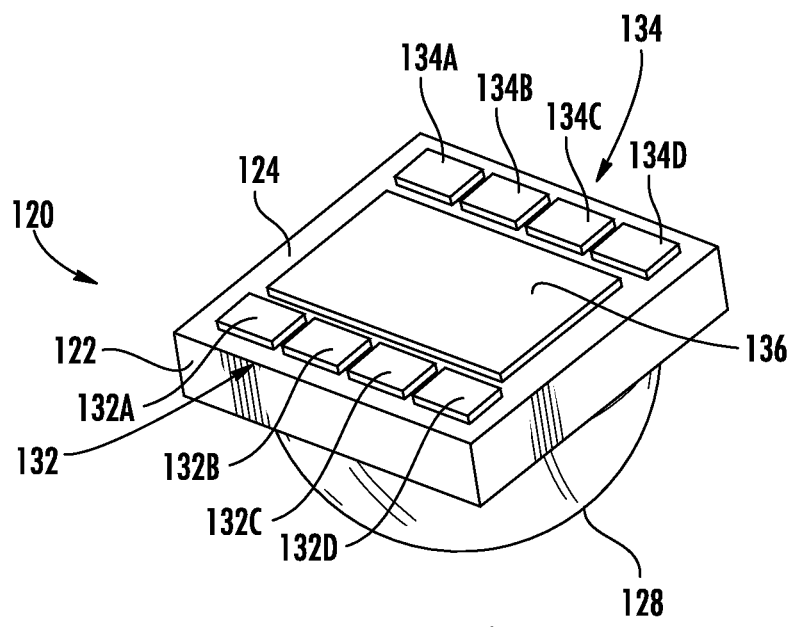
Figure 9A:
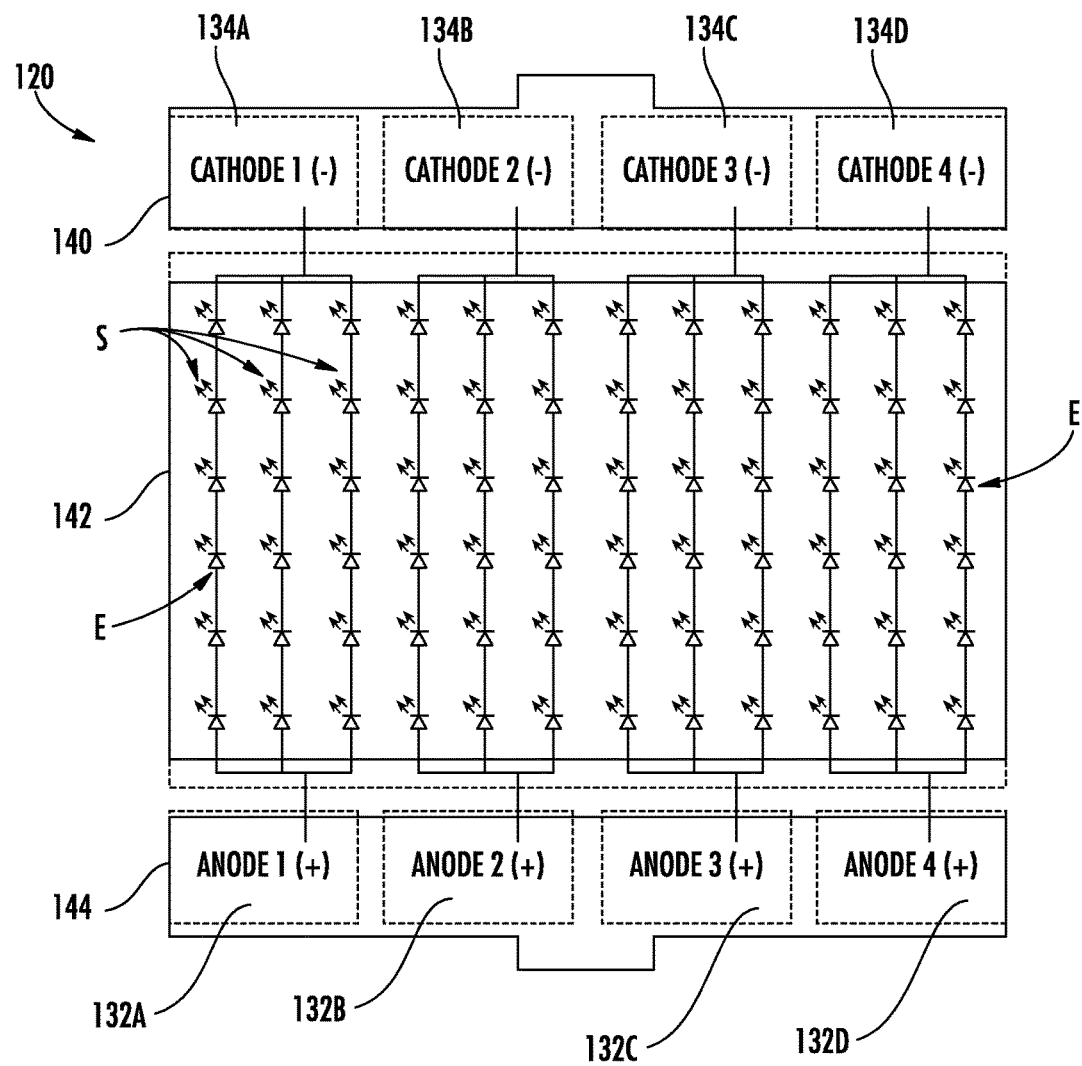
FIGS. 9A to 9C are schematic circuit diagrams illustrating the electrical connectivity of a system comprised of multiple voltage light emitter packages and solder pads according to embodiments of the present subject matter.
Figure 9B:
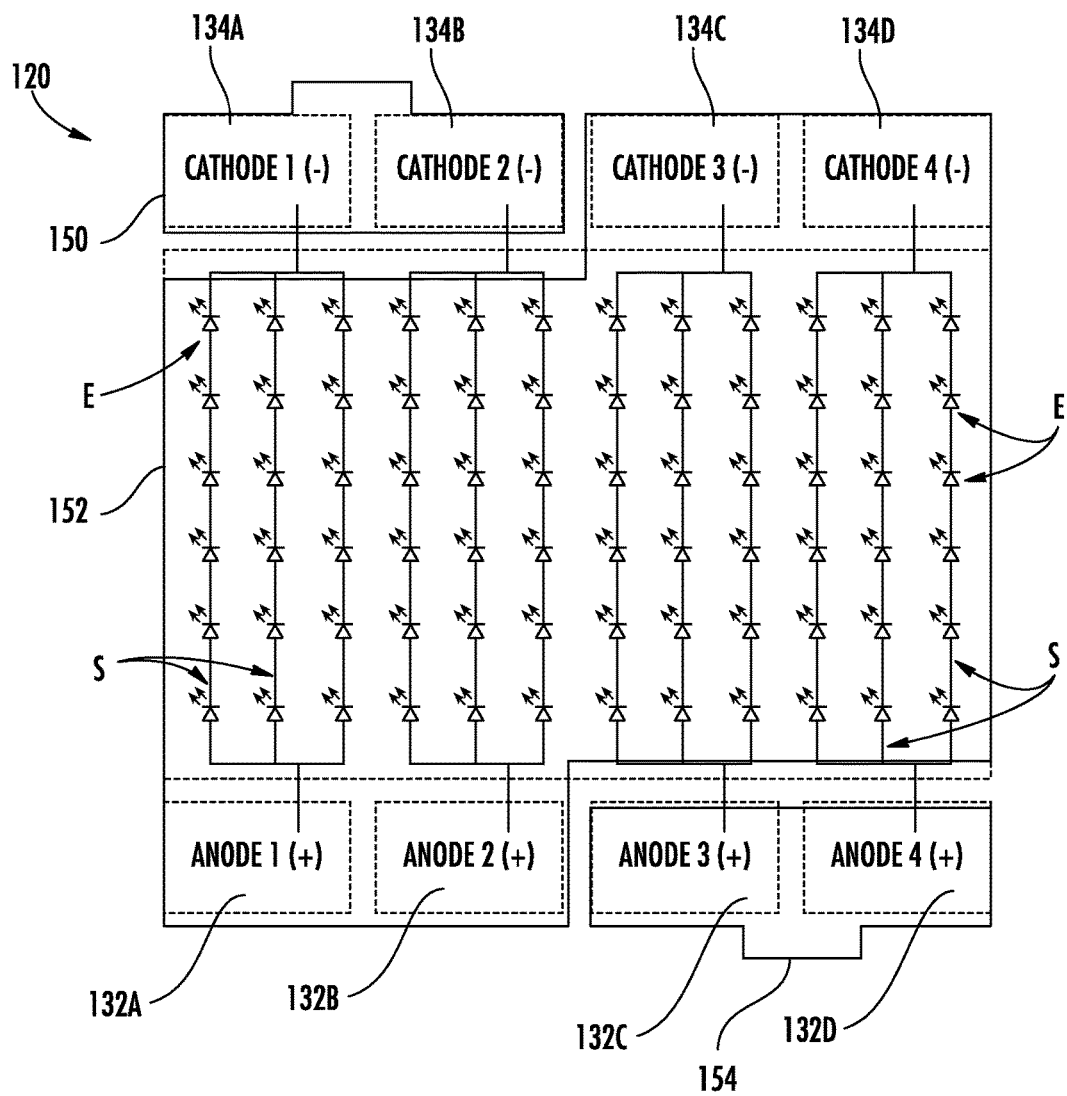
Figure 9C:
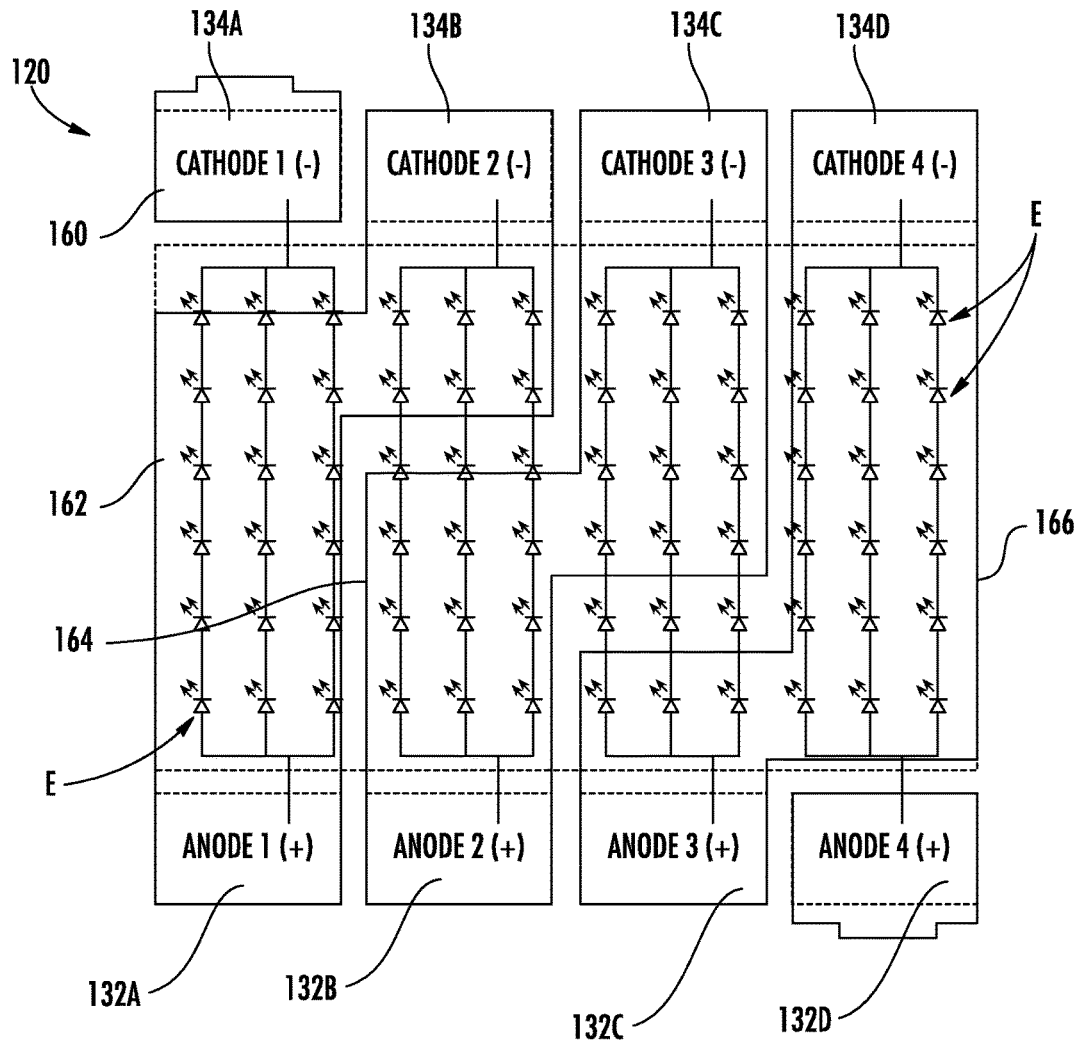

FIGS. 7 and 8 are top and bottom views illustrating another embodiment of a multiple voltage light emitter package, generally designated 120. FIGS. 9A to 9C are schematic circuit diagrams illustrating the electrical connectivity of a system comprising package 120 and a solder pad (e.g., a portion of an external power source or circuit to which package 120 can electrically connect).

Package 120 can comprise a submount 122 having first and second surfaces over which conductive features and light emitter chips can be provided. For example, submount 122 can comprise a bottom surface 124 and a top surface 126. An optical element or lens 128 and an optional protective layer 130 can be provided over top surface 126 of package 120.

Multiple light emitters E can be provided over top surface 126 of package 120. In some aspects, emitters E comprise LED chips provided in an array. In some aspects, light emitters E can be provided in at least one string of serially connected chips, in other aspects multiple strings of serially connected emitters E or chips can be provided, where each string is electrically connected in parallel between a positive terminal and a negative terminal (e.g., an anode and a cathode) provided on top surface 126 of package 120. The anode and the cathode on top surface 126 to which light emitters E electrically connect, can electrically communicate with one or more contact pads on bottom surface 124 of package 120 using internal conductive through-holes or vias (not shown).

The terms "optical element" and the "lens" as used in this disclosure are intended to be construed in the broadest sense of the terms. Such an element may affect light by bending and/or concentrating light rays, influencing the light beam and resultant beam pattern, by color mixing, or by a combination of these effects. A phosphor can also be used over individual light emitters E and/or lens 128 for providing wavelength conversion. Lenses described herein can for example comprise glass or plastic, may be molded in place or elsewhere, or otherwise formed or attached to the package as desired. For example, lens 128 may comprise a molded silicone lens. In some embodiments, a clearance is again maintained between the edge of any of the plurality of light emitters E and the edge of the lens.

In one aspect, lens 128 can be provided over a portion of light emitters E. Lens 128 can provide both environmental and/or mechanical protection. Lens 52 can be in any location over top surface 126 of submount 122, and either centered over submount 122 and emitters E, or non-centered with respect to submount 122 and/or emitters E. As FIG. 7 illustrates, lens 128 can comprise a substantially circular lens base. However, as FIG. 1 illustrates and as described above, lenses can comprise a non-circular base and/or an asymmetrical three-dimensional shape. Any size and/or shape of lens can be provided. In some embodiments lens 128 can be formed in direct contact with emitters E and top surface 126 of submount 122. In other embodiments there may be an intervening material or layer disposed between emitters E and top surface 126. Direct contact to emitters E may provide certain advantages such as improved light extraction and ease of fabrication.

Protective layer 130 can provide additional protection to emitters E and package 120 components, for example, components (e.g., traces) disposed on top surface 126 to reduce damage and contamination during subsequent processing steps and use. Protective layer 130 can be formed during formation of lens 128 and can comprise the same material as the lens 128. It is understood, however, that LED package 120 can also be provided without the protective layer and/or lens.

Lenses described herein can also be easily adapted for use with secondary lenses or optics that can be included over a respective lens 128 by an end user to facilitate beam shaping. Such secondary lenses are generally known in the art, with many of them being commercially available.

Referring to FIG. 8 and in some aspects, package 120 can comprise a surface mount package for mounting over and physically/electrically connecting with an external power source or circuit (e.g., a PCB, flex circuit, MCPCB, etc.), using surface mount technology. Package 120 can comprise a first end 132 and a second end 134. Multiple surface mount pads referred to as contact pads can be provided at each end. For example, first end 132 can comprise four contact pads 132A, 132B, 132C, and 132D for contacting an external power source or circuitry. Second end 134 can likewise comprise four contact pads 134A, 134B, 134C, and 134D for contacting (e.g., and electrically/physically communicating with) an external power source or circuitry. Although four contact pads are shown at each end, more or less than four contact pads can be provided.

Contact pads 132A, 132B, 132C, and 132D at one end 132 of bottom surface 126 can at least partially align with portions of one terminal (e.g., the anode or cathode traces, not shown) on top surface 124 of package 120 and electrically connect thereto using vias or through holes. Similarly, contact pads 134A, 134B, 134C, and 134D at other end 134 of bottom surface 124 can at least partially align with portions of other terminal (e.g., the anode or cathode traces) on top surface 124 of package 120. Contact pads 132A, 132B, 132C, and 132D electrically connect to one terminal (e.g., anode/cathode) of an external power source and contact pads 134A, 134B, 134C, and 134D connect to the other terminal of an external power source for passing electrical current through package 120. For example, in some aspects, contact pads 132A, 132B, 132C, 132D, 134A, 134B, 134C, and 134D can enable surface mounting of package 120 such that electrical signal applied across contact pads at each end (e.g., 132 and 134) can pass into and illuminate light emitters.

Notably, package 120 is operable at multiple different voltages for use in both high and low voltage applications. In some aspects, package 120 can comprise multiple anode-cathode channels, between and/or through which electrical current can become channeled differently through multiple emitters E. The multiple channels can comprise one or more anode-cathode channels established as current passes between one or more contact pads at first end 132 (e.g., 132A, 132B, 132C, 132D) and one or more contact pads at second end 134 (e.g., 134A, 134B, 134C, 134D). In some aspects, current passes between all four contact pads at first end 132 and all four contact pads second end 134. In other aspects, current only passes between certain specific pairs of contact pads comprising at least one pad at first end 132 and at least one pad at second end 134 (e.g., channels can comprise 132A-134A, 132A-134B, 132A-134C, 132A-134D, etc.). Thus, package 120 can comprise a single anode-cathode channel component or a multiple anode-cathode channel component for operation at multiple different voltages.

Package 120 can further comprise a metallized area or thermal pad 136 on bottom surface 124 of submount 122. Thermal pad 136 can optionally be disposed between contact pads at first end 132 and contact pads at second end 134. Thermal pad 136 can comprise an area of thermally conductive material and can be at least partially vertical aligned below light emitters E for dissipating heat from package 120. In some embodiments, thermal pad 136 is not in electrical contact with any of the other conductive features (e.g., traces, contact pads) on bottom or top surfaces 124 and 136, respectively, of submount 122. However, in some embodiments, contact pads can electrically communicate with each other via thermal pad 136 (e.g., in instances where a solder pad is configured to electrically connect certain pairs of contact pads, FIG. 5B).

FIGS. 9A to 9C are schematic circuit diagrams illustrating for example the electrical connectivity of a system comprised of light emitter package 120 and solder pads according to embodiments of the present subject matter. FIGS. 9A to 9C illustrate multiple anode-cathode channels capable of illuminating emitters E. In some aspects, systems depicted in FIG. 9A to 9C can be operable between approximately 18V and 72V, thereby useful in multiple applications at both low and high voltages.

FIGS. 9A to 9C illustrate electrical connectivity between the contact pads of FIG. 8 and exposed portions (e.g., solder pads) of an external power source such as an electrical circuit, flexible circuit, PCB, MCPCB, etc. In FIGS. 9A to 9C, contact pads 132A, 132B, 132C, 132D, 134A, 134B, 134C, and 134D (FIG. 8) are schematically illustrated in broken lines, whereas solder pads of an external circuit are illustrated in solid lines. As FIGS. 9A to 9C illustrate, multiple strings S of emitters E can be provided per package 120, and by changing the current flow through package 120 (e.g., via routing current through one or more anode-cathode channels) the voltage of the package and/or system can be varied. In some aspects, 72 light emitters E are provided per package, however, more or less emitters E can also be provided.

As FIG. 9A illustrates, a solder pad can comprise a first outer portion 140, a central portion 142, and a second outer portion 144, similar to that shown in FIG. 5A. FIG. 9A illustrates a single anode-cathode channel system, as current flows into emitters E by flowing between each of the four anodes (e.g., 132A, 132B, 132C, and 132D) and the four cathodes (134A, 134B, 134C, and 134D) via outer portions 140 and 144 of solder pad. Central portion 142 remains electrically isolated (e.g., physically and electrically separated) from outer portions 140 and 144. In some aspects, the system of FIG. 9A is operable at approximately 18V. In some aspects, the voltage can be increased by adding and/or activating additional anode-cathode channels. In some aspects, multiple packages 120 can be electrically connected in parallel over the external power source or circuitry.

As FIG. 9B illustrates, a solder pad can comprise a first outer portion 150, a central portion 152, and a second outer portion 154, similar to that shown in FIG. 5B. FIG. 9B illustrates a system having multiple anode-cathode channels, as current flows into emitters E by flowing between two pair of anodes and cathodes. For example, current can flow between two of the four anodes (e.g., 132A and 132B) and two of the four cathodes (134C and 134D). Notably, current can flow at least partially over central portion 152 of solder pad. Another anode-cathode channel between anodic contact pads 132C and 132D and cathodic contact pads 134A and 134B can be activated. Central portion 142 can remain electrically isolated (e.g., physically and electrically separated) from outer portions 140 and 144. The solder pads illustrated in FIG. 9B also allows multiple packages 120 to be electrically connected in series. In some aspects, increasing the number of anode-cathode channels increases the package and/or system voltage. For example, the system and package 120 of FIG. 9B can be operable at approximately 36V.

As FIG. 9C illustrates, a solder pad can comprise four anode-cathode channels. Any number of channels can be provided. For example, the solder pad comprises a first portion 160, a second portion 162, a third portion 164, a fourth portion 166, and a fifth portion 168. Each portion can comprise an anode-cathode channel configured to direct current across or between certain anode-cathode pads. For example, second portion 162 electrically connects contact pad 132A with contact pad 134B for passing current therebetween. Each other portion (e.g., 164, 166, etc.) can electrically connect specific anodic contact pads (one, two, three, etc.) with other specific cathodic contact pads. The solder pads illustrated in FIG. 9C also allow multiple packages 120 to be electrically connected in series. In some aspects, increasing the number of anode-cathode channels increases the voltage. For example, the system and package 120 of FIG. 9C can be operable at approximately 72V. In some aspects, an end user can utilize packages described herein and choose from multiple anode-cathode channels. Such channels represent parallel circuits of equal voltage in the package. The user can then connect the packages in series or parallel to adjust the system current/voltage profile.

Embodiments as disclosed herein may provide one or more of the following beneficial technical effects: reduced cost of providing light emitter packages; multiple anode-cathode channels for operability at selectable voltages including both high and low voltage applications; flexibility in high/low voltage applications; improved product yields; decreasing inventory; improved ease of manufacture; improved ease of installation; high brightness; improved color rendering; improved reliability; improved brightness; improved thermal properties and/or thermal management; and/or improved color mixing.

While the light emitter packages, systems, and methods have been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein. Various combinations and sub-combinations of the structures and features described herein are contemplated and will be apparent to a skilled person having knowledge of this disclosure. Any of the various features and elements as disclosed herein may be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

The invention claimed is:

1. A light emitter package comprising:
a submount having a plurality of contact pads disposed thereon; and
a plurality of light emitting diode (LED) chips disposed over the submount and connected between a first trace and a second trace;
wherein the plurality of contact pads comprises at least two pairs of contact pads, wherein each pair of the at least two pairs of contact pads includes a first contact pad connected to the first trace and a second contact pad connected to the second trace; and
wherein the at least two pairs of contact pads are configured to be connected to an external circuit that is selectively configurable to route electrical current by at least two different paths through the plurality of LED chips without re-configuring the plurality of LED chips, and wherein the package is operable at least in two different voltages.

2. The light emitter package of claim 1, wherein at least one voltage of the at least two different voltages is approximately 3 Volts (V).

3. The light emitter package of claim 1, wherein at least one voltage of the at least two different voltages is approximately 6 Volts (V).

4. The light emitter package of claim 1, wherein at least one voltage of the at least two different voltages is approximately 9 Volts (V).

5. The light emitter package of claim 1, wherein at least one voltage of the at least two different voltages is approximately 12 Volts (V).

6. The light emitter package of claim 1, wherein at least one voltage of the at least two different voltages is approximately 36 Volts (V).

7. The light emitter package of claim 1, further comprising a thermal pad, and wherein the package is configurable for electrical current to pass through the thermal pad in a first configuration or for electrical current not to pass through the thermal pad in a second configuration.

8. The light emitter package of claim 1, wherein each of the plurality of LED chips comprises at least one positive contact and at least one negative contact disposed on a same face thereof.

9. A light emitter system comprising:
a light emitter package comprising a submount having a plurality of light emitting diode (LED) chips disposed on a first surface thereof;
a thermal pad provided over a second surface of the submount that opposes the first surface, wherein the thermal pad is centrally aligned with respect to the plurality of LED chips; and
an external circuit configured to physically and electrically communicate with portions of the package to define a plurality of anode-cathode channels that are each in communication with the plurality of LED chips;
wherein the external circuit is configured so that at least one of the plurality of anode-cathode channels electrically communicates with the thermal pad of the package for providing a system that is operable at least in two different voltages.

10. The system of claim 9, wherein at least one voltage of the at least two different voltages is approximately 3 Volts (V).

11. The system of claim 9, wherein at least one voltage of the at least two different voltages is approximately 6 Volts (V).

12. The system of claim 9, wherein at least one voltage of the at least two different voltages is approximately 9 Volts (V).

13. The system of claim 9, wherein at least one voltage of the at least two different voltages is approximately 12 Volts (V).

14. The system of claim 9, wherein at least one voltage of the at least two different voltages is approximately 36 Volts (V).

15. A multiple voltage light emitter package comprising:
a submount comprising a first surface, a second surface, and a plurality of electrically conductive vias extending between the first and second surfaces;
a pair of traces disposed on the first surface of the submount and at least two pairs of contact pads disposed on the second surface of the submount, wherein each pair of the contact pads includes a first contact pad connected to a first trace of the pair of traces and a second contact pad connected to a second trace of the pair of traces to define an anode and a cathode of a respective one of a plurality of anode-cathode channels, and wherein the plurality of electrically conductive vias connect portions of the pair of traces to the at least two pairs of contact pads;
a plurality of light emitting diode (LED) chips disposed over the first surface of the submount and serially connected between the pair of traces; and
wherein each pair of the at least two pairs of contact pads are configured to electrically communicate with the plurality of LED chips via one or more of the plurality of anode-cathode channels whereby the package is operable at multiple different voltages.

16. The light emitter package of claim 15, wherein the anode and cathode of only one pair or both pairs of the at least two pairs of contact pads are configured to electrically communicate with each other for providing a package operable at multiple different voltages.

17. The light emitter package of claim 15, wherein the at least two pairs of contact pads comprises more than two pairs of contact pads, and are disposed on the second surface of the submount.

18. The light emitter package of claim 15, wherein the plurality of LED chips are serially connected in a plurality of strings, and wherein each string of serially connected LED chips is connected in parallel between the pair of traces with each other string of LED chips.

19. The light emitter package of claim 18, wherein each string of LED chips is configured to emit a same color of light.

20. The light emitter package of claim 18, wherein each string of LED chips is configured to emit a different color of light.

21. The light emitter package of claim 20, wherein at least one string of LED chips is configured to emit blue light and wherein at least one other string of LED chips is configured to emit red light.

22. The light emitter package of claim 15, wherein each anode of the at least two pairs of contact pads electrically communicates with each cathode of the at least two pairs of contact pads forming a single anode-cathode channel.

23. The light emitter package of claim 15, wherein one anode of the at least two pairs of contact pads electrically communicates with one other cathode of the at least two pairs of contact pads forming multiple anode-cathode channels.

24. The light emitter package of claim 15, wherein the package is operable at approximately 6 Volts (V) or more.

25. The light emitter package of claim 15, wherein the package is operable at 12 Volts (V) or more.

26. The light emitter package of claim 15, wherein the package is operable at 18 Volts (V) or more.

27. The light emitter package of claim 15, wherein the package is operable at 36 Volts (V) or more.

28. The light emitter package of claim 15, wherein the package is operable at 72 Volts (V) or more.

29. The light emitter package of claim 15, wherein the package further comprises a lens.

30. The light emitter package of claim 29, wherein the lens comprises a circular lens base.

31. The light emitter package of claim 29, wherein the lens comprise a non-circular lens base.

32. The light emitter package of claim 29, wherein the lens comprises an asymmetrical dome.

33. A multiple voltage light emitter system comprising:
a light emitter package comprising:
a submount comprising a first surface, a second surface, and a plurality of electrically conductive vias extending between the first and second surfaces;
a pair of traces disposed on the first surface of the submount and at least two pairs of contact pads disposed on the second surface of the submount, wherein each pair of the at least two pairs of contact pads includes a first contact pad connected to a first trace of the pair of traces and a second contact pad connected to a second trace of the pair of traces to define an anode and a cathode of a respective one of a plurality of anode-cathode channels, and wherein the plurality of electrically conductive vias connect portions of the pair of traces to the at least two pairs of contact pads; and
a plurality of strings comprising a plurality of serially connected (LED) chips disposed over the first surface of the submount, wherein each string of LED chips is electrically connected in parallel between the pair of traces; and
an external circuit comprising a solder pad configured to physically and electrically communicate with the package, wherein the solder pad is configured to apply electrical signal across only one pair or both pairs of the at least two pairs of contact pads whereby the package is operable at multiple different voltages.

34. The light emitter system of claim 33, wherein a thermal component of the package is selectively configurable for electrical communication with respect to portions of the external circuit thereby providing a system that is operable in at least two different voltages.

35. The light emitter system of claim 33, wherein the at least two pairs of contact pads comprises more than two pairs of contact pads, and are disposed on the second surface of the submount.

36. The light emitter system of claim 33, wherein each string of LED chips is configured to emit a same color of light.

37. The light emitter system of claim 33, wherein each string of LED chips is configured to emit a different color of light.

38. The light emitter system of claim 33, wherein the solder pad comprises a single anode-cathode channel configured to electrically communicate with at least some of the contact pads of the light emitter package.

39. The light emitter system of claim 33, wherein the solder pad comprises multiple anode-cathode channels configured to electrically communicate with at least some of the contact pads of the emitter package.

40. The light emitter system of claim 33, wherein the system is operable at 6 Volts (V) or more.

41. The light emitter system of claim 33, wherein the system is operable at 12 Volts (V) or more.

42. The light emitter system of claim 33, wherein the system is operable at 18 Volts (V) or more.

43. The light emitter system of claim 33, wherein the system is operable at 36 Volts (V) or more.

44. The light emitter system of claim 33, wherein the system is operable at 72 Volts (V) or more.

45. The light emitter system of claim 33, wherein the package further comprises a lens.

46. The light emitter system of claim 45, wherein the lens comprises a circular lens base.

47. The light emitter system of claim 45, wherein the lens comprise a non-circular lens base.

* * * * *